US006671500B2

(12) United States Patent
Damgaard et al.

(10) Patent No.: US 6,671,500 B2
(45) Date of Patent: Dec. 30, 2003

(54) FREQUENCY PLAN

(75) Inventors: Morten Damgaard, Laguna Hills, CA (US); Alyosha C. Molnar, Costa Mesa, CA (US); Rahul Magoon, Irvine, CA (US); William J. Domino, Yorba Linda, CA (US); Andrew Zhang, Cerritos, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/823,680

(22) Filed: Mar. 30, 2001

(65) Prior Publication Data

US 2002/0183030 A1 Dec. 5, 2002

(51) Int. Cl.[7] .................................................. H04B 1/04
(52) U.S. Cl. ........................ 455/118; 455/112; 455/113
(58) Field of Search ................................ 455/258, 259, 455/260, 264, 265, 266, 315, 316, 318, 552, 76, 84, 85, 86, 87, 112, 113, 123, 125, 91, 118; 713/501

(56) References Cited

U.S. PATENT DOCUMENTS

| 4,211,975 A | * | 7/1980 | Kuroda ...................... 455/76 X |
| 4,479,257 A | * | 10/1984 | Akiyama ..................... 455/266 |
| 5,696,950 A | * | 12/1997 | Ichinose et al. ............. 713/501 |
| 6,122,506 A | * | 9/2000 | Lau et al. ................ 455/552 X |

FOREIGN PATENT DOCUMENTS

| EP | 0 798 880 A2 | 1/1997 | ............ H04B/7/22 |
| WO | WO 92/01337 | 1/1992 | ............ H04B/1/30 |

OTHER PUBLICATIONS

U.S. patent application No. 09/260,919 filed Mar. 2, 1999, Dmitriy Rozenblit, et al., "Direct Conversion Receiver", 43 pages.

U.S. patent application No. 09/370,099, filed Aug. 6, 1999, Magoon, et al., "Programmable Frequency Divider", 60 pages.

U.S. patent application No. 09/386,865, filed Aug. 31, 1999, Dmitriy Rozenblit, et al., "Multi–Band Transceiver Utilizing Direct Conversion Receiver", 77 pages.

U.S. patent application No. 09/398,911, filed Sep. 14, 1999, Damgaard and Magoon, "Wireless Transmitter Having Modified Translation Loop Architecture", 47 pages.

Ian Doyle, "A Simplified Subharmonic I/Q Modulator", *Applied Microwave & Wireless*, Oct. 1998.

Takafumi Yamaji et al., "An I/Q Active Balanced Harmonic Mixer with IM2 Cancelers and a 45° Phase Shifter", *IEEE Journal of Solidfa–State Circuits*, vol. 33, No. 12, Dec. 1998.

* cited by examiner

Primary Examiner—Nay Maung
Assistant Examiner—Philip J. Sobutka
(74) Attorney, Agent, or Firm—Thomas, Kayden, Horstemeyer & Risley, LLP

(57) ABSTRACT

A system is disclosed for transmitting and receiving signals. The system includes the use of a frequency plan table a system for creating the frequency plan table. The frequency plan table relates carrier frequency channels to the operation of a synthesizer and a plurality of programmable frequency dividers in a locked loop. In a transmitter, a first programmable frequency divider accepts a reference signal and produces a comparison signal. A mixer accepts the reference signal and a transmission signal and produces a loop signal. A second programmable frequency divider accepts the loop signal and produces a loop signal having a divided intermediate frequency signal. A phase detector compares the comparison signal and the loop signal having a divided intermediate frequency and produces an output that controls a variable controlled oscillator. The variable controlled oscillator produces a modulated transmission signal.

23 Claims, 10 Drawing Sheets

FIG. 1 Wireless Communication System

Fractional N
Phase-Locked-Loop

Translation-Locked-Loop

Quadrature Mixer

FREQUENCY PLAN

BACKGROUND OF THE INVENTION

1. Field of the Invention

The invention plan generally relates to wireless communication systems and, more particularly, to systems for transmitting and receiving signals that utilize frequency plans.

2. Related Art

Wireless communication systems are an integral component of the ongoing technology revolution and are evolving at an exponential rate. Wireless communication systems are generally radio frequency (RF) communication systems. Many wireless communication systems are configured as "cellular" systems, in that the geographic area to be covered by the cellular system is divided into a plurality of "cells." Mobile communication devices (e.g., wireless telephones, pagers, personal communications devices, and the like) in the coverage area of a cell communicate with a fixed base station within the cell. The wireless communication system is also capable of communicating with stationary communication devices, though most applications employ the mobile communication devices described above.

In cellular wireless communication systems, the mobile communication devices interface with a base station that is generally a low-power base station. Low-powered based stations are utilized so that frequencies used in one cell can be re-used in cells that are a sufficient distant away to avoid interference. Hence, a mobile communication device user, whether mired in traffic gridlock or attending a meeting, can transmit and receive signals, such as phone calls, so long as the user is within a cell served by a base station.

The communication format used in most wireless communications systems is a high-frequency carrier waveform modulated by low frequency, or "baseband," signals. The baseband signal may include audio and/or data signals. Mobile communication devices within a wireless communication system typically have a transmitter, the transmitter having a modulator and an upconverter. The modulator "modulates" the baseband signals (e.g., speech detected by the handset microphone) onto the carrier waveform. The upconverter increases the frequency of the low frequency modulated signals to the carrier waveform frequency appropriate for the wireless communication system. The carrier waveform is then sent from the mobile communication device to a base station. Amplitude modulation (AM) and frequency modulation (FM) techniques, for example, are well known to those of ordinary skill in the art. Mobile communication devices also typically have a receiver, the receiver having a demodulator and a downconverter. The demodulator "demodulates" a carrier waveform received from a base station to extract a received baseband signal that is then sent for processing to a baseband module of the mobile communication device. The downconverter decreases the carrier waveform frequency to the frequency appropriate for processing by the baseband module of the mobile communication device.

In the mobile communication device, the received carrier waveform and the transmitted carrier waveform are generally processed with a synthesizer-generated signal having a reference frequency. Generally, the synthesizer includes at least two variable controlled oscillators. The oscillators allow the mobile communication device to achieve greater power efficiency by processing the audio and/or data signals at lower frequencies than the carrier frequency. A first variable controlled oscillator may be used to receive audio and/or data, and a second variable controlled oscillator may be used to transmit audio and/or data. Separate variable controlled oscillators may be used for reception and transmission to allow the mobile communication device to operate at more than one carrier frequency. In addition, separate variable controlled oscillators for reception and transmission allows for one to be shut down while the mobile communication device is performing the other function. Furthermore, use of a separate transmit variable controlled oscillators eliminates the necessity for switching variable controlled oscillators in the synthesizer. However, this solution may be more expensive than using a single synthesizer for reception and transmission.

In some communication systems, such as Global System for Mobile Communications (GSM) systems, it is particularly efficient to integrate component functions since transmission and reception are not performed simultaneously. In particular, the value of integrating synthesizer, receiver, and transmitter functions is maximized. However, when functions are integrated, mobile communication devices operating in GSM wireless communication systems are particularly vulnerable to undesirable interactions between signals.

In the transmitter, the carrier waveform that is modulated is usually a high frequency, periodic waveform generated by the synthesizer. The synthesizer may generate the periodic waveform with a variable controlled oscillator. The variable controlled oscillator may be a voltage controlled oscillator. The frequency of the oscillator should be adjustable since the transmitter is often required to transmit on many different frequency channels within a transmission band. In some GSM wireless communication systems, for example extended GSM (EGSM), the transmission band is 880–915 MHz and is divided into 200 kHz channels. Thus, the oscillator frequency must be varied in precise steps of 200 kHz. Voltage controlled oscillators are well suited for such applications since their output frequency is easily adjusted by manipulating a control voltage. However, oscillators producing signals having disparate frequencies produce undesired spurious effects.

Ideally, transceiver synthesizers would only contain one oscillator to eliminate spurious effects. However, because of the widely disparate frequency ranges of the GSM, DCS, and PCS systems, transceivers with a single main oscillator to cover the required frequencies suffer from poor performance characteristics. At the same time, designs employing separate oscillators for each of the bands are undesirable due to the cost involved.

Another problem is that multi-band handsets using multiple synthesizer oscillators utilize off-chip components such as filters for each of the oscillators. The filters may be surface acoustic wave filters. These off-chip components tend to consume excessive space. Thus, they are inconsistent with the goal of providing compact, lightweight, and portable mobile communication devices.

Direct conversion receivers employ an oscillator operating at the same frequency as the received carrier waveform. Direct conversion receivers eliminate the need for some of the off-chip components such as filters. However, current direct conversion receivers are susceptible to self-conversion to DC of the local oscillator signal or large RF blockers. In addition, direct conversion transceivers tend to be vulnerable to leakage between signals on the oscillator frequency and the radio frequency ports of the mixers. A third problem with direct conversion transceivers is that the reference signal tends to leak onto the transmitter components and ends up being radiated by the antenna. This leakage can interfere with other similar receivers that may be in the same area.

The operation of mobile communication devices results in a number of signals with similar frequencies in the same area. This may lead to undesirable interactions between the signals. This problem is particularly acute in non-linear systems such as mixers.

SUMMARY

The invention provides a system for transmitting signals using a frequency plan transmitter and receiver. The frequency plan allows for the selection of transmission and reception channels while using a single reference signal for a receiver and a transmitter and avoiding undesirable frequency interactions.

The system for transmitting signals using a frequency plan table can be implemented as follows. A first programmable frequency divider accepts a reference signal having a local oscillation frequency. The reference signal is the product of passing a synthesizer signal through a local oscillation chain. The local oscillation chain is capable of providing a plurality of local oscillation frequencies. The first programmable frequency divider produces a comparison signal having a comparison frequency. A mixer accepts the reference signal and a modulated transmission signal. The mixer produces a transmit-loop signal having an intermediate frequency. A modulator is capable of inserting data into the transmit-loop signal. A second programmable frequency divider accepts the transmit-loop signal and produces a transmit-loop signal having a divided intermediate frequency signal. A phase detector compares the comparison signal and the transmit-loop signal having a divided intermediate frequency. The phase detector produces a signal that controls a variable controlled oscillator. And, the variable controlled oscillator produces the transmission signal.

The operation of the first and second programmable frequency divider, and the synthesizer, may be based on operating parameters stored in a frequency plan table. The frequency plan table operating parameters being based on the desired transmission signal characteristics and the minimization of undesirable frequency based signal interactions within a mobile communication device.

Other systems, methods, features and advantages of the frequency plan will be or will become apparent to one of ordinary skill in the art upon examination of the following figures and detailed description. It is intended that all such additional systems, methods, features and advantages be included within this description, be within the scope of the frequency plan, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

FIG. 7 also includes the frequency plan table of FIG. 3.

DETAILED DESCRIPTION

1. Overview

Figure 1:
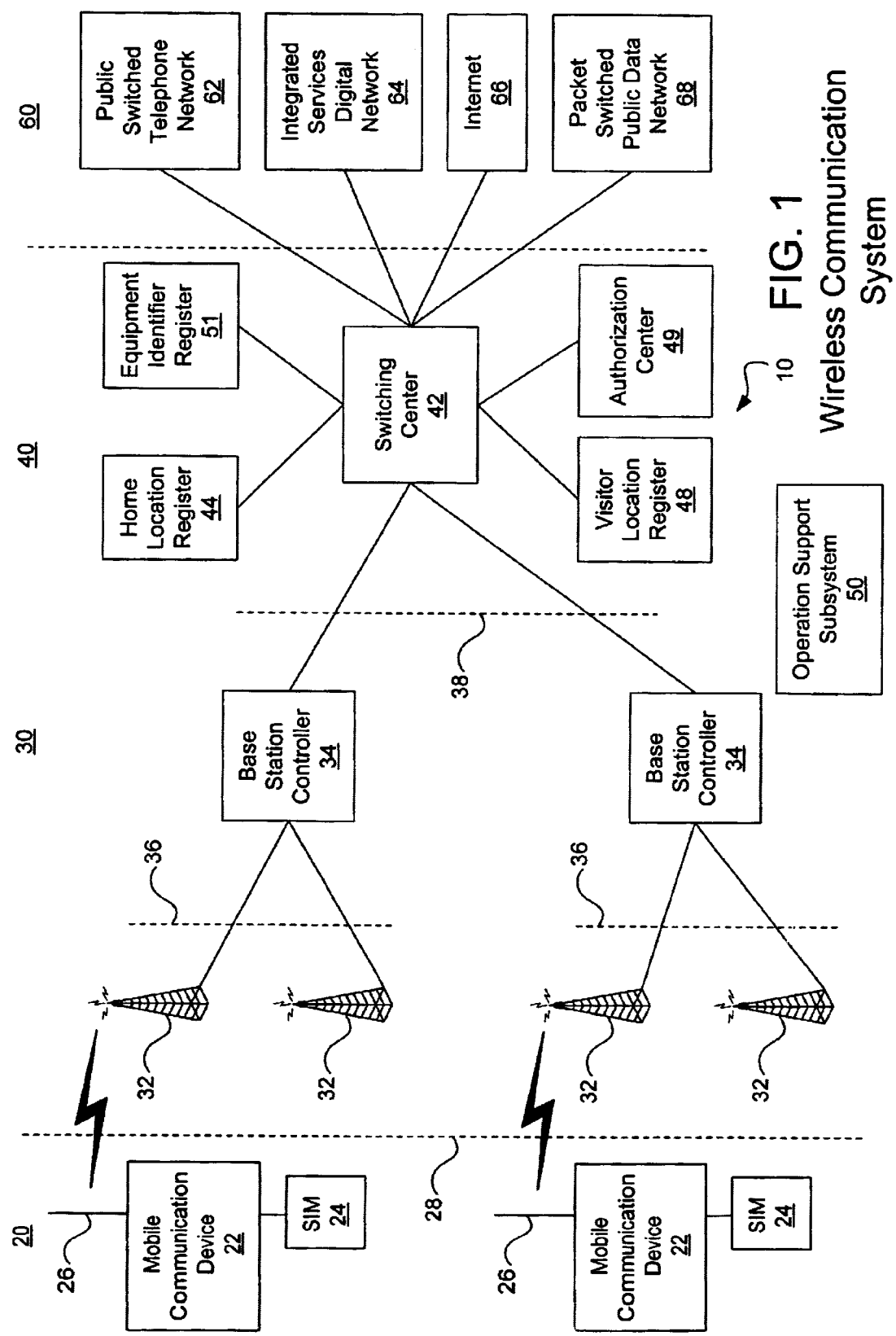
FIG. 1 is a block diagram of an exemplar wireless communication system including mobile communication devices.

Before describing the invention in detail, it is useful to describe an example environment in which the invention can be implemented. One such example is a wireless communication system. FIG. 1 is a block diagram of an exemplary wireless communication system 10 including mobile communication devices 22. The mobile communication devices 22 may be cellular phones. For illustrative purposes, the invention will be described in the context of a wireless communication system adhering to the Global System for Mobile Communications (GSM) standard. It should be understood, however, that the frequency plan of the invention could be implemented in the context of other wireless communication systems.

One of the most common forms of wireless communications systems, mobile cellular systems, were originally developed as analog systems. After their introduction for commercial use in the early 1980s, mobile cellular systems began to experience rapid and uncoordinated growth. In Europe, for example, individual countries developed their own systems. Generally, the systems of individual countries were incompatible with each other, which constricted mobile communications within national boundaries and restricted the market for mobile equipment developed for a particular country's system.

In 1982, in order to address this growing problem, the Conference of European Posts and Telecommunications (CEPT) formed the Groupe Spéciale Mobile (prior to 1991 was also known as GSM) to study and develop a set of common standards for a future pan-European cellular network. It was recommended that two blocks of frequencies in the 900 MHz range be set aside for the system. The initial goals for the new system included international roaming ability, good subjective voice quality, compatibility with other systems such as the integrated services digital network (ISDN), spectral efficiency, low cost mobile communication devices 22 cost and low cost base transceiver stations 32, and the ability to support new services and a high volume of users.

One of the initial, major decisions in the development of the GSM standard was adoption of a digital, rather than an analog, system. As mentioned above, analog systems were experiencing rapid growth and the increasing demand was straining the capacity of the available frequency bands. Digital systems offer improved spectral efficiency and are more cost efficient. The quality of digital transmission is also superior to that of analog transmission. Background sounds such as hissing and static and degrading effects such as fadeout and cross talk are largely eliminated in digital systems. Security features such as encryption are more easily implemented in a digital system. Compatibility with the integrated services digital network is more easily achieved with a digital system. Finally, a digital approach permits the use of very large scale integration (VLSI), thereby facilitating the development of smaller and more efficient mobile handsets.

In 1989, the European Telecommunications Standards Institute (ETSI) took over responsibility for the GSM standards. In 1990, phase I of the standard was published and the first commercial services employing the GSM standard were launched in 1991. It was also renamed in 1991 as the Global System for Mobile Communications (still GSM). After its early introduction in Europe, the standard was elevated to a global stage in 1992 when introduced in Australia. Since then, GSM has become the most widely adopted and fastest growing digital cellular standard, and is positioned to become the world's dominant cellular standard. As of January 1999, according to the GSM memorandum of understanding association, GSM accounted for more than 120 million subscribers.

Two frequency bands of 25 MHz each were allocated for GSM use: the 890–915 MHz band and the 935–960 MHz band. The 890–915 MHz band is reserved for transmission or "uplink" (mobile communication device 22 to base transceiver station 32), and the 935–960 MHz band is reserved for reception or "downlink" (base transceiver station 32 to mobile communication device 22). An extra ten MHz of bandwidth was later added to each frequency band. The standard incorporating this extra bandwidth (resulting in two 35 MHz bands) is known as Extended GSM (EGSM). In EGSM, the transmission band covers 880–915 MHz and the receiving band covers 925–960 MHz. The terms GSM and EGSM are used interchangeably, with GSM sometimes used in reference to the extended bandwidth portions (880–890 MHz and 925–935 MHz). Sometimes, the originally specified 890–915 MHz and 935–960 MHz bands are designated Primary GSM (PGSM). In the following description of the wireless communication system 10, GSM will be used in reference to the extended bandwidth (35 MHz) standard.

Due to the expected widespread use of GSM, capacity problems in the 900 MHz frequency bands were anticipated and addressed. ETSI had already defined an 1800 MHz variant (digital communication system (DCS) or GSM 1800) in the first release of the GSM standard in 1989. In DCS, the transmission band covers 1710–1785 MHz and the receiving band covers 1805–1880 MHz. In the United States, the Federal Communications Commission (FCC) auctioned large blocks of spectrum in the 1900 MHz band, aiming to introduce digital wireless systems to the country in the form of a mass market personal communication service (PCS). The equivalent of DCS GSM service in the United States is known as PCS or GSM 1900. In PCS, the transmission band covers 1850–1910 MHz and the receiving band covers 1930–1990 MHz.

Regardless of the GSM standard used, once a mobile communication device 22 is assigned a channel, a fixed frequency relationship is maintained between the transmit frequency and receive frequency. In GSM, this fixed frequency relationship is 45 MHz. If, for example, a mobile communication device 22 is assigned a transmit channel at 895.2 MHz, its receive channel will always be at 940.2 MHz. A fixed frequency relationship is also maintained in DCS and PCS, however, the frequency relationship is wider. In DCS, the receive channel is always 95 MHz higher than the transmit channel and, in PCS the receive channel is always 80 MHz higher than the transmit channel.

The architecture of one implementation of a wireless communication system 10 is depicted in block form in FIG. 1. Wireless communication system 10 is divided into four interconnected components or subsystems: a mobile device subsystem 20, a base station subsystem 30, a network switching subsystem 40, and an operation support subsystem 50. Generally, mobile device subsystem 20 is the mobile communication device 22 (e.g., wireless telephones, pagers, personal communications devices, and the like) carried by a user of the mobile communication device 22. Though entitled a "mobile" communication device 22, there is nothing about the technology that requires the device be mobile and those having ordinary skill in the art will recognize applications for the low voltage digital interface other than in relationship to the wireless communication system 10 and the mobile communication device 22.

The base station subsystem 30 interfaces with multiple mobile communication devices 22 and manages the radio transmission paths between the mobile communication devices 22 and the network switching subsystem 40. The network switching subsystem 40 manages the wireless communication system 10 switching functions and facilitates communications with other systems such as the public switched telephone network (PSTN) 62 and the integrated services digital network 64. Furthermore, the operation support subsystem 50 facilitates operation and maintenance of the wireless communication system 10.

Mobile device subsystem 20 comprises a plurality of mobile communication devices 22 each associated with a subscriber identity module (SIM) 24. Mobile communication device 22 includes an antenna 26. Subscriber identity module 24 is a memory device that stores identification information regarding the subscriber and the mobile communication device 22. The subscriber identity module 24 may be implemented as a smart card or as a plug-in module and activates service from any wireless communication device 22 in the wireless communication system 10. Among the information stored on subscriber identity module 24 may be a unique international mobile subscriber identity (IMSI) that identifies the user of the mobile communication device 22 to the wireless communication system 10, and an international mobile equipment identity (IMEI) that uniquely identifies the mobile communication device 22. A user can access the wireless communication system 10 via any mobile communication device 22 or terminal through use of the subscriber identity module 24. Other information, such as a personal identification number (PIN) and billing information, may be stored on subscriber identity module 24.

Mobile device subsystem 20 communicates with a base station subsystem 30 across a standardized "Um" or radio air interface 28. Base station subsystem 30 includes multiple base transceiver stations (BTS) 32 and base station controllers (BSC) 34. A base transceiver station 32 is usually in the geographic center of a cell and includes one or more radio transceivers and an antenna. The base transceiver station 32 establishes radio links and handles radio communications over the "Um" interface 28 with mobile communication devices 22 within the cell. The transmitting power of the base transceiver station 32 defines the size of the cell. Each base station controller 34 manages a plurality of base transceiver stations 32. Communication between base transceiver station 32 and base station controller 34 is over a standardized "Abis" interface 36. The base station controller 34 allocates and manages carrier frequency channels and controls handover of calls between the base transceiver stations 32 that the base station controller 34 manages.

Each base station controller 34 may communicate with the network switching subsystem 40 over a standardized "A" interface 38. The A interface 38 may use a switching system seven (SS7) protocol and allow the use of base stations and switching equipment made by different manufacturers. Switching center 42 is the primary component of the network switching subsystem 40. Switching center 42 manages communications between each mobile communication device 22 within the cells and between mobile communication devices 22 and public networks 60. Examples of public networks 60 that switching center 42 may interface with include the public switched telephone network (PSTN) 62, the integrated services digital network (ISDN) 64, the Internet 66, and the packet switched public data network (PSPDN) 68.

Switching center 42 may interface with various databases to manage communication and switching functions. For example, home location register (HLR) database 44 may contain details on each mobile communication device 22 user residing within the area served by the switching center 42, including subscriber identities, services to which the subscriber has access to, and their current location within the system. Visitor location register (VLR) database 48 may temporarily store data relating to users roaming with a mobile communication device 22 within the coverage area of the switching center 42. Equipment identity register (EIR) database 51 may contain a list of mobile communication devices 22, each identified by an international mobile equipment identity that is valid and authorized to use the wireless communication system 10. Information relating to mobile communication devices 22 that have been reported as lost or stolen may be stored on a separate list of invalid mobile communication devices. The list of invalid mobile communication devices may assist in identifying persons who are illegally attempting to access the wireless communication system 10. The authorization center (AuC) database 49 stores authentication and encryption data and parameters that verify the identity of user of a mobile communication devices 22.

Operation support subsystem 50 contains one or several operation maintenance centers (OMC) that monitor and maintain records on the performance of all components of the wireless communication system 10. Operation support subsystem 50 may maintain all hardware and system operations, manage charging and billing operations, and manage all mobile communication devices 22 within the system.

With respect to communications between the mobile communication device 22 and the base transceiver station 32, the available carrier frequency channels are distributed among the base transceiver stations 32 according to a base transceiver frequency plan. In the wireless communication system 10, the transmitting and receiving bands may be divided into 200 kHz carrier frequency channels. To increase system capacity, a time division multiple access (TDMA) frame structure may be used to subdivide each of the carrier frequency channels into multiple time slots. Each time slot may have a duration of approximately 0.577 milliseconds, and eight time slots may form a time division multiple access "frame," having a duration of 4.615 milliseconds. This framework permits simultaneous reception by as many as eight mobile communication devices 22 on a first carrier frequency channel and simultaneous transmission by as many as eight mobile communication devices 22 on a second carrier frequency channel.

2. Example Mobile Communication Device

Figure 2:
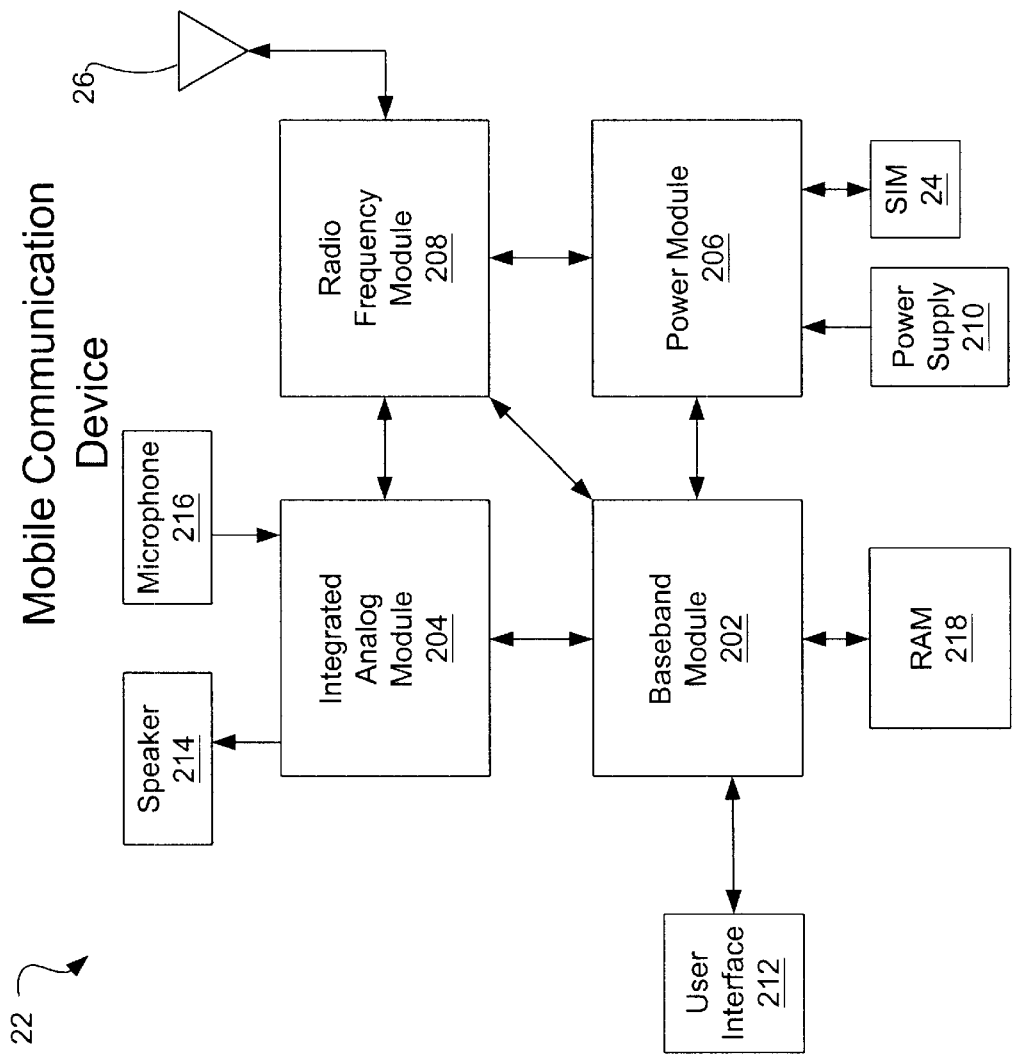
FIG. 2 is a block diagram of the internal components of the mobile communication device of FIG. 1 including a baseband module, an integrated analog module, and a radio frequency module.

FIG. 2 is a block diagram of the internal components of the mobile communication device 22 of FIG. 1 including a baseband module 202, an integrated analog module 204, a power module 206, and a radio frequency module 208. The mobile communication device 22 may be implemented in many different ways having various configurations and architectures. Though the frequency plan is not limited to any particular device or architecture, in order to provide a framework for describing the frequency plan, an example mobile communication device 22 architecture is described with reference to FIG. 2. Those of ordinary skill in the art will recognize that many of the components described with reference to FIG. 2 may be eliminated or combined with other components without affecting the frequency plan.

Mobile communication device 22 also includes a speaker 214, and a microphone 216 connected to the integrated analog module 204. The mobile communication device 22 further includes a user interface 212 and random access memory (RAM) element 218 connected to the baseband module 202. A description of the architecture and functioning of each of the modules follows.

The baseband module 202 may include a baseband digital signal processor (DSP) 310 (FIG. 3), and all interface logic required for the mobile communication device 22. The baseband module 202 may be implemented as an integrated circuit on a single die. The baseband module 202 may also include a dual execution unit with dual multiply accumulation units, a logic unit and a barrel shifter. The baseband module 202 may be implemented in a 32-bit architecture that can handle single 32-bit, or a dual 16-bit, instructions.

Baseband module 202 directs the overall operation of the mobile communication device 22 and is ordinarily programmed or coded with a computer program or routine to enable the baseband module 202 to carry out its operation. In one implementation, baseband module 202 is housed in a 128 pin thin quad flat pack (TQFP) and, in another implementation, baseband module 202 is housed in a 160-pin 12×12 mm chip array ball grid array (CABGA) package. The CABGA package may allow for the design of smaller form factors resulting in a smaller mobile communication device 22.

The baseband module 202 may interface with the radio frequency module 208, the user interface 212, and the RAM 218. The baseband module may also interface with the speaker 214, and the microphone 216 via the integrated analog module 204. The user interface 212 may include a display and a keyboard. The integrated analog module 204 implements an analog-to-digital converter (ADC) 320 (FIG. 3), digital-to-analog converter (DAC) 322 (FIG. 3), and all other signal conversions required to permit communication between the baseband module 202, the radio frequency module 208, the speaker 214, and the microphone 216. The signal conversions may include timing and interface operations. The integrated analog module 204 may include a coder/decoder. The integrated analog module 204 may be housed in a 100-pin TQFP, or a 100-pin 10×10 mm CABGA package.

The power module 206 is coupled to a power supply 210. The power supply 210 may be a battery or other power source and may be implemented as a power management integrated circuit (PMIC) on a single die. The power module 206 controls the power supply for all of the other components of the mobile communication device 22. The power module 206 may include error detection capabilities for portions of the mobile communication device 22. The error detection capabilities may significantly reduce debugging and test tasks.

The subscriber identity module (SIM) 24, that was described in reference to FIG. 1, may be associated with the power module 206. Through programmable switching regulators, each subscriber identity module 24 may allow the system to become independent of power supply 210 chemistry. The subscriber identity module 24 may be housed in a 48-pin TQFP.

Figure 3:
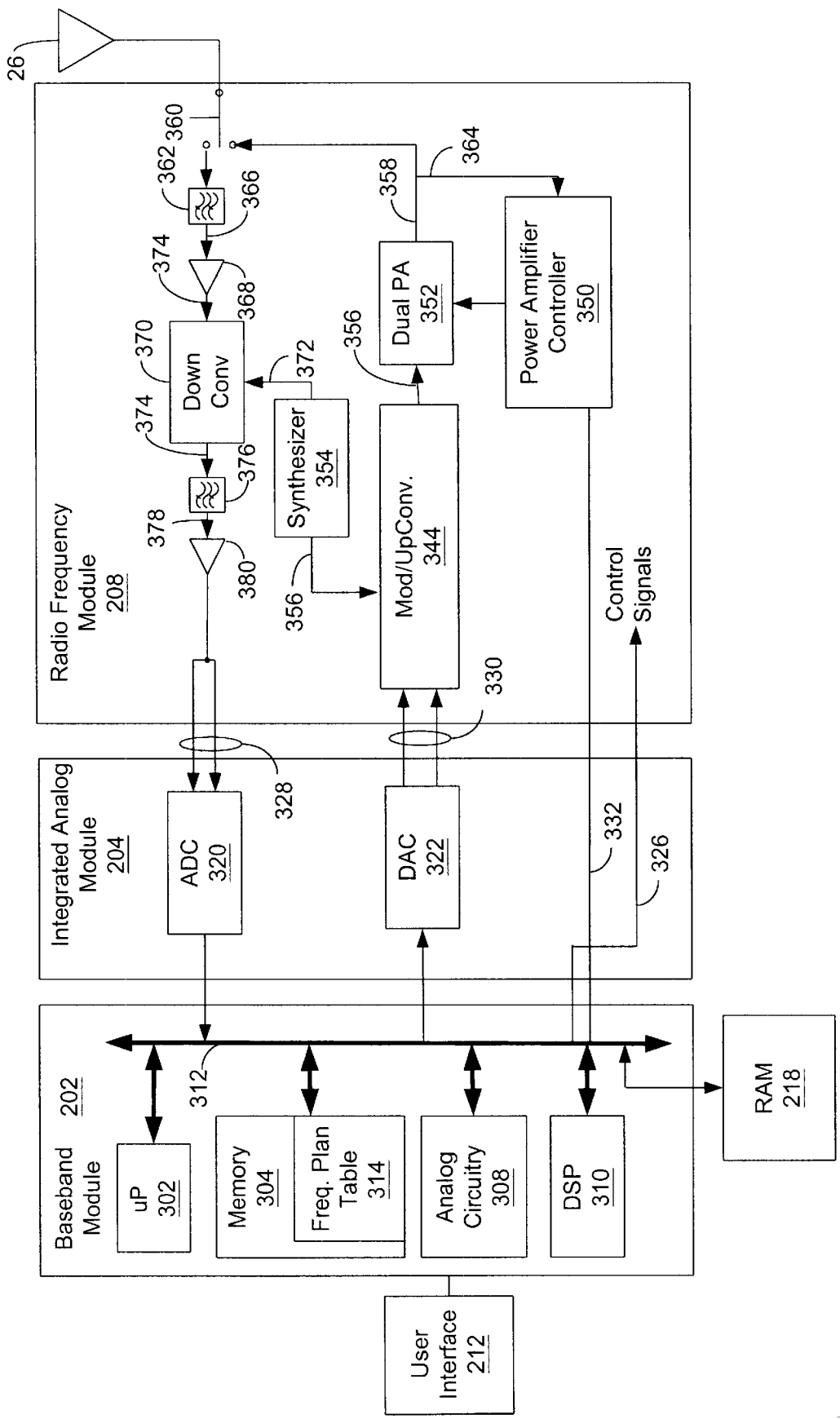
FIG. 3 is a block diagram of the baseband module, the integrated analog module, and the radio frequency module of FIG. 2.

The radio frequency module 208 includes a transmitter, for sending audio and/or data information, a receiver, for receiving audio and/or data information, and a synthesizer 354 (FIG. 3). The synthesizer 354 (FIG. 3) works in cooperation with the transmitter and the receiver. A portion of the radio frequency module 208, such as a radio frequency integrated circuit, may be implemented in a 48-pin TQFP package.

The radio frequency module 208 transmitter may include a dual power amplifier module (Dual PA) 352, a power amplifier controller 350. The dual power amplifier module 352 may include input and output matching, and power-added efficiency features. The dual power amplifier module 352 may be implemented in a 9×11 mm micromodule package.

The power amplifier controller 350 may include a 60 dB dynamic range, an error amplifier, an integrator, and a gain shaper. The power amplifier controller 350 may be capable of supporting 900, 1800 and 1900 MHz GSM frequency bands. If the mobile communication device 22 is capable of supporting 900, 1800 and 1900 MHz GSM frequency bands, the mobile communication device 22 is typically referred to as supporting triband operation. The power amplifier controller 350 may be implemented in a 20-pin thin shrink small outline package (TSSOP) chip. The radio frequency module 208, the transmitter, the receiver, and the synthesizer 354 are described in greater detail in reference to FIG. 3.

The radio frequency module 208 receiver may include dual low noise amplifier (LNA) 368 with selectable gain and associated receive filter 362. The dual low noise amplifier 368 and receive filter 362 may be implemented in a 20-pin TSSOP package.

An overview of the operation of the mobile communication device 22 will now be described in regard to the task of transmitting and receiving audio information. To transmit audio information, the integrated analog module 204 receives an analog audio signal from the microphone 216. The integrated analog module 204 converts the analog signal to a digital signal. The baseband module 202 processes the digital signal and converts the processed digital signal into baseband "I" and "Q" signals. The integrated analog module 204 converts the digital baseband "I" and "Q" signals into an analog stream. The transmitter of the radio frequency module 208 inserts the analog stream into an analog carrier waveform and sends the carrier waveform containing the audio information to a base transceiver station 32 via the antenna 26.

To receive information from the base transceiver station 32, the antenna 26 picks up an analog carrier waveform containing audio information. The radio frequency module 208 extracts the information in analog stream form from the analog carrier waveform. The integrated analog module 204 converts the stream into a digital signal. The baseband module 202 processes the digital signal. The integrated analog module 204 then converts the processed digital signal back into an analog signal that is transformed to an audible sound wave by the speaker 214. The transmitter and receiver may also transmit and receive other types of data such as data that may be displayed on a visual display.

FIG. 3 is a block diagram of the baseband module 202, the integrated analog module 204, and the radio frequency module 208 of FIG. 2. Baseband module 202 includes microprocessor ($\mu$P) 302, memory 304, analog circuitry 308, and digital signal processor (DSP) 310, in communication via bus 312. Bus 312, although shown as a single bus, may be implemented using multiple busses connected as necessary among the subsystems within baseband module 202. The frequency plan table 314 may be stored in several places including, such as the memory 304, the random access memory 218, and in the radio frequency module 208. Microprocessor 302 and memory 304 provide the signal timing, processing and storage functions for mobile communication device 22. Analog circuitry 308 provides the analog processing functions for the signals within baseband module 202. Baseband module 202 provides control signals to radio frequency module 208 via connection 326. Although shown as a single connection 326, the control signals may originate from DSP 310 or from microprocessor 302, and are supplied to a variety of points within radio frequency module 208. It should be noted that, for simplicity, only the basic components of mobile communication device 22 are illustrated.

Integrated analog module 204 includes analog-to-digital converter (ADC) 320 and digital-to-analog converter (DAC) 322. ADC 320 and DAC 322 also communicate with microprocessor 302, memory 304, analog circuitry 308 and DSP 310. DAC 322 converts the digital communication information within baseband module 202 into an analog signal for transmission to radio frequency module 208 via connection 330. Connection 330, shown as two directed arrows, includes the information that is to be transmitted by radio frequency module 208 after conversion from the digital domain to the analog domain.

Radio frequency module 208 includes a synthesizer 354 and modulator/upconverter (MOD/UpConv) 344. The synthesizer produces a synthesizer signal having a synthesizer frequency. The synthesizer signal may be passed through a local oscillation chain 720 (described below in reference to FIG. 7). The synthesizer 354, or the local oscillation chain 720, if used, delivers a reference signal to the modulator/upconverter 344 via connection 356. Alternatively, the local oscillation chain 720 can be located in the modulator/upconverter 344. The modulator/upconverter 344 modulates and upconverts the received analog information and provides a phase modulated signal to dual power amplifier module (Dual PA) 352 via connection 356. Dual power amplifier module 352 amplifies the modulated signal on connection 356 to the appropriate power level for transmission via connection 358 to antenna 26. Illustratively, switch 360 controls whether the amplified signal on connection 358 is transferred to antenna 26 or whether a received signal from antenna 26 is supplied to receive filter 362. The operation of switch 360 is controlled by a control signal from baseband module 202 via connection 326. Optionally, circuitry that enables simultaneous transmission and reception can replace switch 360.

A portion of the amplified transmit signal on connection 358 is supplied via connection 364 to power amplifier control 350 via connection 364. The power amplifier controller 350 supplies the control input to the dual power amplifier module 352.

In the radio frequency module 208, a signal received by antenna 26 may, at the appropriate time determined by baseband module 202, be directed via switch 360 to receive filter 362. Receive filter 362 filters the received signal and supplies the filtered signal on connection 366 to dual low noise amplifier (LNA) 368. Receive filter 362 may be a bandpass filter that passes all channels of the particular wireless communication system 10 in which the mobile communication device 22 is operating. As an example, for a 900 MHz GSM system, receive filter 362 passes some frequencies, including those from 935.1 MHz to 959.9 MHz, covering all 328 contiguous channels of 200 kHz each. The purpose of receive filter 362 is to reject all frequencies outside the desired region. Dual low noise amplifier 368 amplifies the weak signal on connection 366 to a level at which downconverter (DownConv) 370 can translate the signal from the transmitted frequency back to a baseband frequency. Alternatively, the functionality of dual low noise amplifier 368 and downconverter 370 can be accomplished using other elements, such as for example but not limited to, a low noise block downconverter (LNB).

Downconverter 370 receives the frequency reference signal from the synthesizer 354, via connection 372. The frequency reference signal instructs the downconverter 370 as to the proper frequency to which to downconvert the signal received from dual low noise amplifier 368 via connection 374. Downconverter 370 may include a demodulator. The demodulator recovers the transmitted analog information. Alternatively, the demodulator may be a separate stand-alone component. Downconverter 370 sends the downconverted signal via connection 374 to channel filter 376. Channel filter 376 filters the downconverted signal and supplies it via connection 378 to amplifier 380. The channel filter 376 selects the one desired channel and rejects all others. Using the GSM system as an example, only one of the 328 contiguous channels is to be received. After all channels are passed by receive filter 362 and downconverted in frequency by downconverter 370, only the one desired channel appears precisely at the center frequency of channel filter 376. The synthesizer 354, by controlling the reference frequency supplied on connection 372 to downconverter 370, determines the selected channel. Amplifier 380 amplifies the received signal and supplies the amplified received signal via connection 328 to ADC 320. ADC 320 converts these analog signals to a digital signal at baseband frequency and transfers the digital signal to DSP 310 via bus 312.

4. Fractional N Phase-locked-loops

Figure 4:
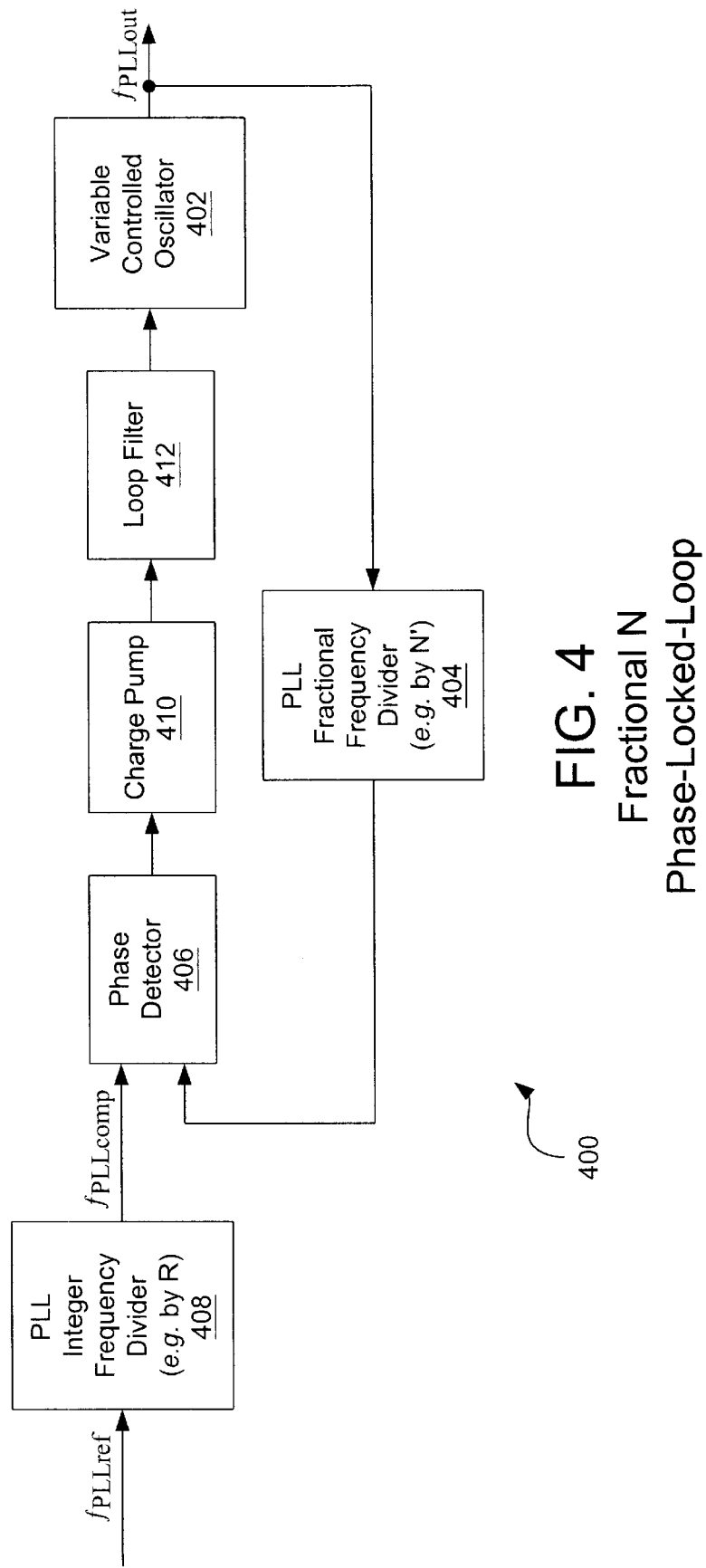
FIG. 4 is a block diagram of a fractional N phase-locked-loop that may be included in the radio frequency module of FIG. 3.

FIG. 4 is a block diagram of a fractional N phase-locked-loop 400 that may be included in the radio frequency module 208 of FIG. 3. The mobile communication device 22 may use phase-locked-loops (PLLs) to generate a desired range of frequencies in transmitters and synthesizers. A fractional N phase-locked-loop 400 incorporating a PLL fractional frequency divider 404 and a PLL integer frequency divider 408 is illustrated in FIG. 4. The fractional N phase locked-loop 400 is provided for a better understanding of the frequency plan.

The fractional N phase-locked-loop 400 includes a variable controlled oscillator 402, the PLL fractional frequency divider 404, a phase detector 406, the PLL integer frequency divider 408, a charge pump 410, and a loop filter 412. The variable controlled oscillator 402 may be a voltage controlled oscillator. The PLL fractional frequency divider 404 and the PLL integer frequency divider 408 may be programmable frequency dividers.

The fractional N phase-locked-loop 400 outputs a PLL output signal having a frequency $f_{PLLout}$ within a defined frequency band. The fractional N phase-locked-loop 400 also uses a PLL reference, or clock signal, having a frequency $f_{PLLref}$. The PLL reference signal is introduced to the PLL integer frequency divider 408. The divider of the PLL integer frequency divider 408 may be represented by the integer variable "R". The PLL integer frequency divider 408 outputs a PLL comparison signal having a PLL comparison frequency $f_{PLLcomp}$, where:

$$f_{PLLcomp} = \frac{f_{PLLref}}{R}.$$

The PLL comparison signal frequency $f_{PLLcomp}$ may be equal to the required step size or frequency resolution of the fractional N phase-locked-loop 400.

The frequency resolution may be the transmission channel bandwidth. Each frequency channel (e.g., 900 to 900.2 MHz, 900.2 to 900.4 MHz, 900.4 to 900.6 MHz) is related to the reference frequency $f_{PLLref}$ (e.g., 0.2 MHz), the fractional divider (e.g. R), associated with the PLL fractional frequency divider 404, and the integer divider, associated with the a PLL integer frequency divider 408. In a phase-locked-loop, the variable controlled oscillator 402 locks to the comparison signal and tracks any modulation contained in the comparison signal (to the extent that modulation is passed through the loop filter 412).

PLL fractional frequency divider 404 divides the variable controlled oscillator 402 output signal by N', where $$N' = N + \frac{[0:M-1]}{2^M},$$

"M" is a bit binary number, and "N" is an integer. The output of PLL fractional frequency divider 404 is a PLL fractionally divided signal having the same frequency as the comparison frequency, $$f_{PLLcomp} = \frac{f_{PLLref}}{R} = \frac{f_{PLLout}}{N'}.$$

The PLL fractionally divided signal and the PLL comparison signal are introduced to a phase detector 406. The phase detector 406 compares the phase of the PLL fractionally divided signal to the phase of the PLL comparison signal and produces an output that varies based on the comparison. The phase detector 406 output is generally a variable voltage. The phase detector 406 variable voltage output controls the frequency of the variable controlled oscillator 402. The phase detector 406 variable voltage output is generally passed through the charge pump 410 and loop filter 412 before being introduced to the variable controlled oscillator 402. The frequency of the output signal may be represented by:

$$f_{out} = \frac{f_{PLLref}}{R}\left(N + \frac{[0:M-1]}{2^M}\right) \quad \text{(equation 1)}$$

Hence, the variable controlled oscillator 402 PLL output signal having frequency $f_{PLLout}$ can be varied by changing the value of the PLL fractional frequency divider 404 variable N'. As shown, additional flexibility can be provided by passing the PLL reference signal through the PLL integer frequency divider 408, thereby making the step size programmable.

However, in the case where $f_{PLLout}$ is not an integer multiple of $f_{PLLref}/R$, i.e. where, $$\frac{[0:M-1]}{2^M} \quad \text{(equation 2)}$$

is not equal to 0 or 1, harmonics of $f_{PLLref}/R$ may appear as unwanted fractional tones of $f_{PLLout}$. The transmission frequency plan tends to reduce or eliminate this problem.

5. Translation-locked-loop Transmitters

Figure 5:
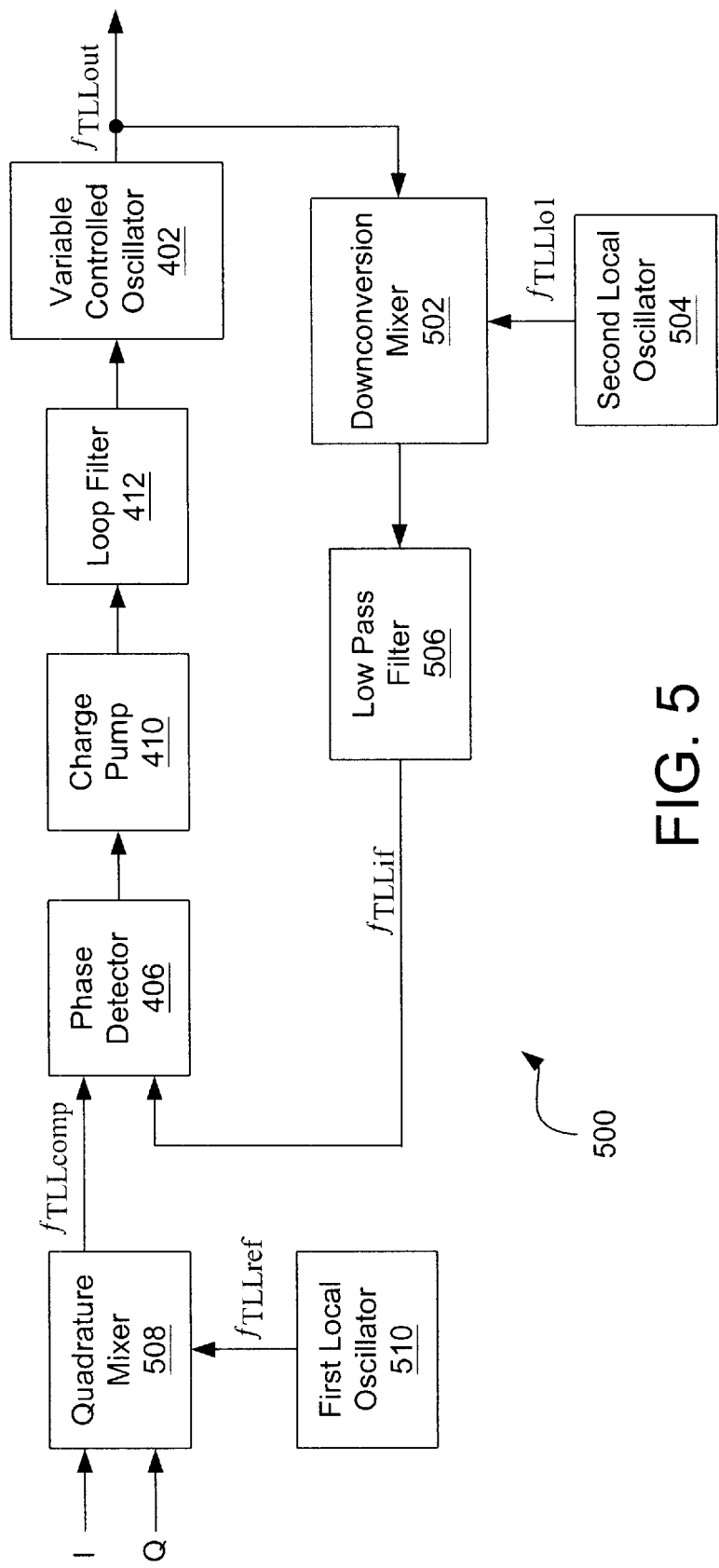
FIG. 5 is a block diagram of a translation-loop including a quadrature mixer that may be included in the radio frequency module of FIG. 3.

FIG. 5 is a block diagram of a translation-locked-loop (TLL) 500 including a quadrature mixer 508 that may be included in the radio frequency module 208 of FIG. 3. The mobile communication device 22 may use translation-locked-loops (TLLs) to generate a modulated signal with a desired range of frequencies. The translation-locked-loop 500 is shown and described for a better understanding of the frequency plan.

The translation-locked-loop 500 may include the quadrature mixer 508 associated with a first local oscillator 510, a downconversion mixer 502 associated with a second local oscillator 504, and a low pass filter 506. The translation-locked-loop 500 may also include phase detector 406, charge pump 410, loop filter 412, and variable controlled oscillator 402.

In a translation-locked-loop 500, modulation is typically performed by the quadrature mixer 508. The quadrature mixer 508 modulates the baseband audio and/or data signals ("I" and "Q") onto a TLL reference signal having frequency $f_{TLLref}$, wherein the TLL reference signal is generated by the first local oscillator 510. The output of the quadrature mixer 508 is a TLL modulated comparison signal having a frequency $f_{TLLcomp}$ where frequency $f_{TLLcomp}$ is the same as the TLL reference frequency $f_{TLLref}$. The TLL modulated comparison signal is a first input to the phase detector 406.

In the translation-locked-loop 500, the variable controlled oscillator 402 outputs a TLL modulated output signal having a frequency $f_{TLLout}$. The TLL modulated output signal is supplied to antenna 26. The TLL modulated output signal is also downconverted to a TLL intermediate frequency signal having frequency $f_{TLLif}$, where frequency $f_{TLLif}$ is equal to frequency $f_{TLLcomp}$. The TLL intermediate frequency signal is a passed through low pass filter 506 prior to introduction to the phase detector 408 as the second input. Downconversion mixer 502 downconverts the TLL modulated output signal to the TLL intermediate frequency signal.

Variable controlled oscillator 402 may have a bandwidth corresponding to the GSM transmit band of 880–915 MHz. For DCS operation, variable controlled oscillator 402 may have a bandwidth corresponding to the DCS transmit band of 1710–1785 MHz. For a dualband transmitter, two separate variable controlled oscillators may be provided, one having a GSM transmit bandwidth and the other having a DCS transmit bandwidth.

The downconversion mixer 502 accepts the TLL modulated output signal from the variable controlled oscillator 402 as a first input and accepts a TLL downconversion signal generated by a second local oscillator 504 as a second input. The TLL downconversion signal has a frequency $f_{TLLlo1}$. Downconversion mixer 502 produces the TLL intermediate frequency signal having a frequency $f_{TLLif}$ by mixing the TLL modulated output signal from the variable controlled oscillator 402 with the TLL downconversion signal from the second local oscillator 504. The bandwidth of second local oscillator 504 is typically in the range of 1200–1500 MHz. For GSM operation, downconversion mixer 502 operates in "high side injection" mode. In high side injection mode, the frequency of second local oscillator 504 is higher than the frequency $f_{TLLout}$ of the TLL modulated transmit signal. In GSM mode, the frequency $f_{TLLif}$ of the TLL intermediate frequency signal produced by downconversion mixer 502 can be expressed as:

$$f_{TLLif} = f_{TLLlo1} - f_{TLLout} (GSM).$$

For DCS operation, downconversion mixer 502 operates in "low side injection" mode; the frequency of second local oscillator 504 is lower than that of the transmit signal— $f_{TLLout}$. In DCS mode, the frequency $f_{TLLif}$ of the TLL intermediate frequency signal produced by downconversion mixer 502 can be expressed as:

$$f_{TLLif} = f_{TLLout} - f_{TLLlo1} (DCS).$$

The TLL intermediate frequency signal output by downconversion mixer 502 is filtered by low pass filter 506, and is then the second input to phase detector 406.

An overview of the operation of the translation-locked-loop 500 will now be described in regard to the task of transmitting audio information. Analog voice signals are captured by microphone 216 and are converted to a digital signal stream and processed into baseband "I" and "Q" signals by baseband module 202. The digital baseband "I" and "Q" signals are converted into analog "I" and "Q" signals by a digital to analog converter 322. The analog "I" and "Q" signals are then introduced to the quadrature mixer 508.

Quadrature mixer 508 mixes the "I" and "Q" signals with a ninety-degree phase-displaced TLL reference signal from first local oscillator 510 and sums the resulting signals to generate a TLL modulated comparison signal at frequency $f_{TLLcomp}$. Typically, first local oscillator 510 has a frequency range of 350–400 MHz. The modulated output of quadrature mixer 508 is introduced to phase detector 406. Phase detector 406 adjusts the output of the variable controlled oscillator 402 as necessary to correct for any detected phase differences between the signals from downconversion mixer 502 and quadrature mixer 508. A TLL modulated output signal is sent by the variable controlled oscillator 402 to an antenna 26 for transmission.

Figure 6:
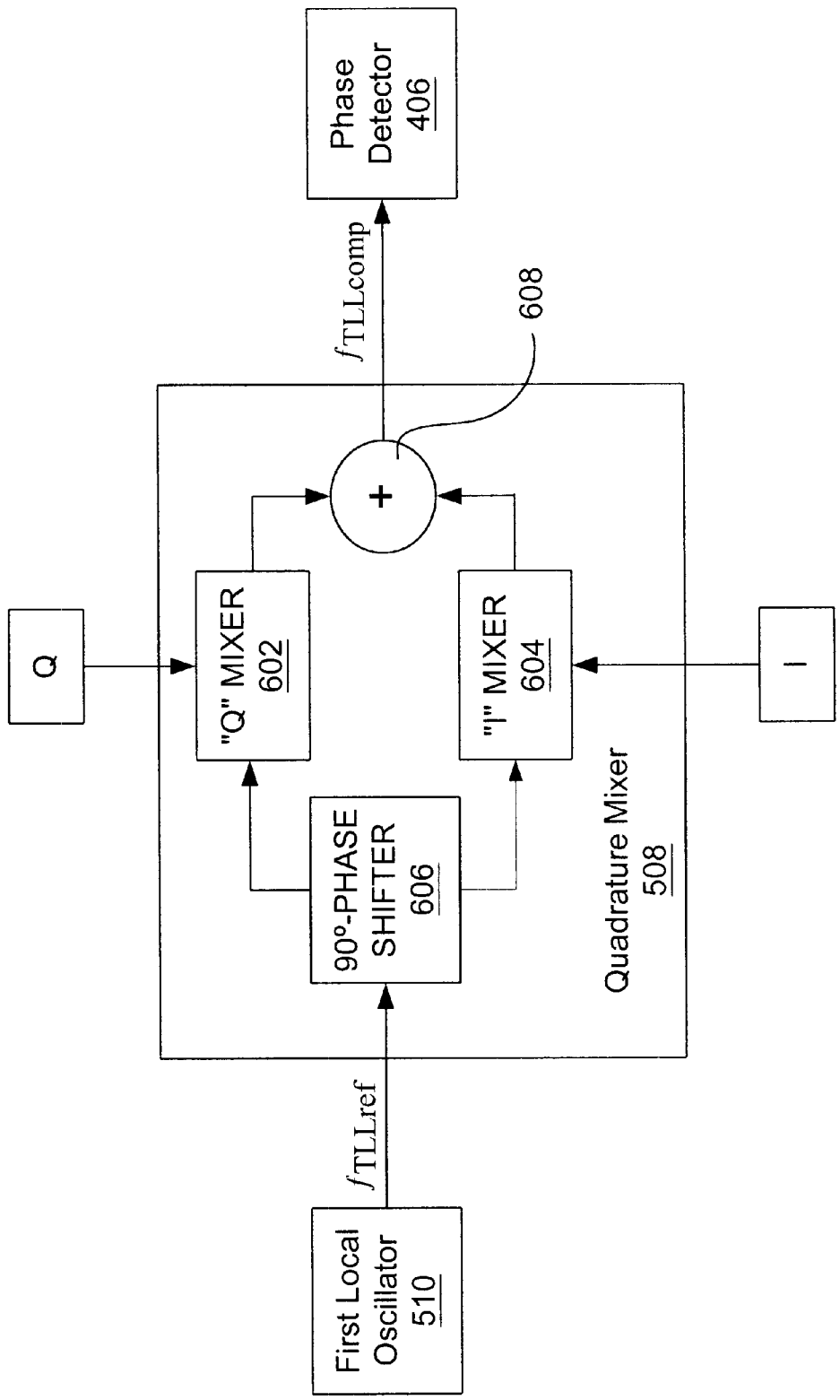
FIG. 6 is a block diagram of the quadrature mixer of FIG. 5.

FIG. 6 is a block diagram of the quadrature mixer 508 of FIG. 5. The quadrature mixer 508 includes a "Q" mixer 602, an "I" mixer 604, a 90°-phase shifter 606, and a summer 608. Phase shifter 606 splits the TLL reference signal from first local oscillator 510 into two 90° phase-displaced signals. "I" Mixer 604 mixes the "I" modulating signal with a 0° reference signal, and "Q" mixer 602 mixes the "Q" modulating signal with a 90° reference signal. Summer 608 combines the output signals from "Q" mixer 602 and "I" mixer 604 to form a TLL modulated comparison signal having both "I" and "Q" components.

In FIG. 5, phase detector 406 compares the phase of the TLL modulated comparison signal at frequency $f_{TLLcomp}$ from quadrature mixer 508 with the phase of the TLL intermediate frequency signal at frequency $f_{TLLif}$ from the low pass filter 506. Based on the comparison of the signal phases, phase detector 406 generates an appropriate output signal. If the phases of the two signals are aligned, the loop is "locked". No adjustment voltage is asserted and variable controlled oscillator 402 continues to oscillate at the same frequency. If one signal leads or lags the other, phase detector 406 outputs a pulse proportional to the phase difference between the two signals. The output pulses are commonly referred to as "up" or "down" signals and typically have a width or duration corresponding to any phase difference between the phase detector 406 input signals.

Charge pump 410 generates a current that adjusts the variable controlled oscillator 402 output based on the signal received from phase detector 406. The charge pump 410 current is increased or decreased as necessary to correct for phase leads or lags. If the translation-locked-loop 500 is locked, the charge pump 410 current is neither increased nor decreased to compensate for phase errors. Loop filter 412 develops a control voltage from the charge pump 410 current and applies it to the variable controlled oscillator 402. A common configuration for a loop filter 412 is a simple single-pole, low-pass filter that can be realized with a single resistor and capacitor. Variable controlled oscillator 402 oscillates about a specific frequency channel that is adjusted as necessary by the control voltage applied by loop filter 412. The bandwidth of the frequency channel is typically 200 kHz.

The use of two local oscillators, first local oscillator 510 and second local oscillator 504, can be problematic, as spurious mixing products can be created through leakage of the oscillator signals. The TLL reference signal from first local oscillator 510 may leak to second local oscillator 504 and generate mixing products, or vice-versa. Though filters, such as loop filter 412 and low pass filter 506, are employed to attenuate such spurious mixing products, low frequency products ("zero crossing" spurs) may not be attenuated by the filters and may cause corruption and spurious modulation of the TLL modulated output signal. Additionally, the use of a quadrature mixer or modulator is not always ideal, as it increases the required circuitry and decreases the cost efficiency of the transmitter. U.S. patent application Ser. No. 09/398,911, entitled "Wireless Transmitter Having a Modified Translation Loop Architecture," discloses a system that allows for the elimination of one of the local oscillators and allows for programming of a variable controlled oscillator through either the local oscillator frequency, or division or multiplication factors. U.S. patent application Ser. No. 09/398,911 is entirely incorporated herein by reference.

6. Frequency Plan

Figure 7:
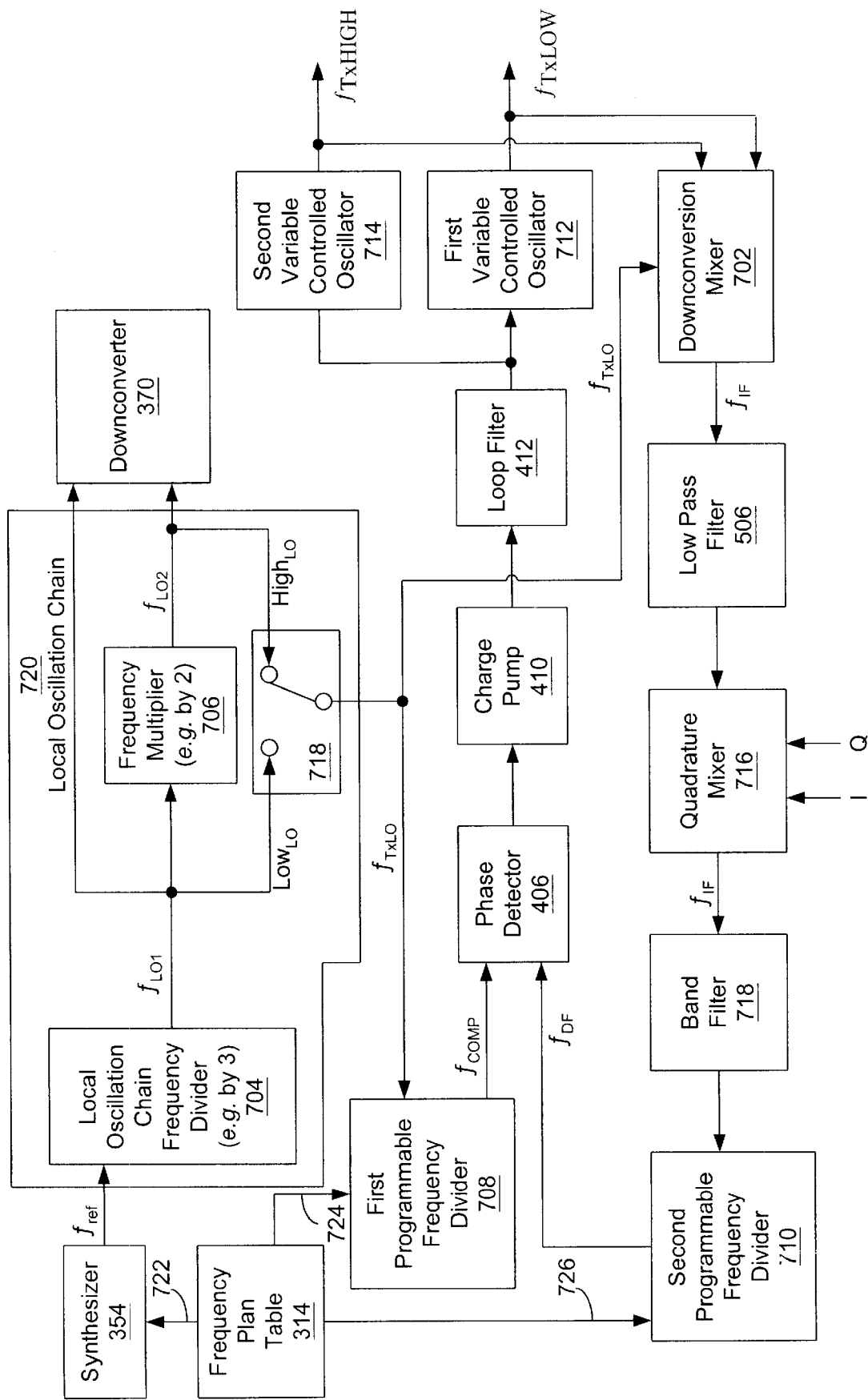
FIG. 7 is a block diagram of part of the radio frequency module of FIG. 3 including a synthesizer, and portions of the modulator/upconverter.

FIG. 7 is a block diagram of part of the radio frequency module 208 of FIG. 3 including the synthesizer 354, portions of the modulator/upconverter 344, the frequency plan table 314, the downconverter 370, and a local oscillation chain 720. The local oscillation chain 720 includes a local oscillation chain frequency divider 704, a frequency multiplier 706, and a switch 718.

The portions of the modulator/upconverter shown in FIG. 7 include a downconversion mixer 702, a first programmable frequency divider 708, a second programmable frequency divider 710, a first variable controlled oscillator 712, a second variable controlled oscillator 714, a quadrature mixer 716, and a band filter 718. The modulator/upconverter 344 may also include the phase detector 406, the charge pump 410, the loop filter 412, and the low pass filter 506.

Although described with particular reference to a portable transceiver, the frequency plan system can be implemented in any device in which it is desirable to eliminate the undesirable spurious frequency effects. The frequency plan system can be implemented in software, hardware, or a combination thereof. In one embodiment, selected portions of the frequency plan system are implemented in hardware and software. The hardware portion of the frequency plan can be implemented using specialized hardware logic. The software portion can be stored in a memory and be executed by a suitable instruction execution system (microprocessor). The hardware implementation of the frequency plan system can include any or a combination of the following technologies, are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The frequency plan system software comprises an ordered listing of executable instructions for implementing logical functions. The frequency plan system can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium includes the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The synthesizer 354 produces a synthesizer signal that includes a reference frequency $f_{ref}$. The synthesizer 354 signal may be processed by a local oscillation chain 720 that produces two signals based on the synthesizer 354 signal reference frequency $f_{ref}$.

The local oscillation chain 720, although shown separately from the synthesizer 354, may be included as an integral part of any of the components of the radio frequency module 208, such as the synthesizer 354. Alternatively, the local oscillation chain 720 may be a stand-alone unit. In one embodiment, the local oscillation chain frequency divider 704 is a divide-by-three frequency divider and the frequency multiplier 706 is a multiply-by-two frequency multiplier. The local oscillation chain frequency divider 704 may of the type described in U.S. patent application Ser. No. 09/370,099, entitled "Programmable Frequency Divider." U.S. patent application Ser. No. 09/370,099 is entirely incorporated herein by reference.

The output of the divide-by-three frequency divider 704 provides a low oscillation signal having a first local oscillator frequency $f_{LO1}$. The output of the frequency multiplier 706 provides a high oscillation signal having a second local oscillation frequency $f_{LO2}$. The low oscillation signal having frequency $f_{LO1}$ may be used for transmission and reception in a communication system operating in a lower frequency band, such as GSM. The high oscillation signal having frequency $f_{LO2}$ may be used for transmission and reception in a communication system operating in a higher frequency band, such as DCS. The output of the local oscillation chain 720 switch 718 is a reference signal having a transmission local oscillation frequency $f_{TxLO}$ where the reference signal may be the output of local oscillation chain frequency divider 704 or the output of frequency multiplier 706 depending upon the operation of switch 718. Switch 718 selects the first or the second oscillation signal depending upon the carrier frequency band the mobile communication device 22 is operating in. The reference signal is passed on to the downconversion mixer 702 and the first programmable frequency divider 708.

The first programmable frequency divider 708 may divide by variable D1. First programmable frequency divider produces a comparison signal having a frequency $f_{COMP}$. Comparison signal is then introduced as a first input to phase detector 406.

The local oscillation chain 720 allows the receiver local oscillation signal frequency and the transmitter local oscillation signal frequency to be offset from the reception and transmission carrier signal frequencies. Keeping the local oscillation signal frequencies offset from the carrier signal frequencies minimizes the chances of undesirable frequency coupling and associated down-mixing of carrier signals.

Employing the same synthesizer 354 signal to provide the receiver and transmitter local oscillation signals allows for the elimination of expensive components from the mobile communication device 22 transceivers. The low and high oscillation signals produced by the local oscillator chain 720 may be used by the receiver and transmitter to process carrier signals that include audio and/or data information. In particular, the signals produced by the local oscillator chain 720 may be used by the receiver to convert carrier frequencies to baseband frequencies, and may be used by the transmitter to convert baseband frequencies to carrier frequencies. The signals produced by the local oscillation chain 720, and based on the synthesizer 354 signal, can also be viewed as the means to select the reception and transmission frequency channels. This dual use of the synthesizer 354 also allows for the design of more compact mobile communication devices 22.

However, synthesizers 354 may exhibit undesirable high spurious responses. Single synthesizer fractional-N phase-locked-loop synthesizers have a propensity to exhibit high spurious responses near integer-N divide ratios due to their high comparison frequencies and low divide ratios. The undesirable spurs may cause the transmit modulation mask to exceed industry specifications. The undesirable frequency spurs associated with technology such as single synthesizer fractional-N phase-locked-loop synthesizers may be diminished with the frequency plan. The frequency plan includes a frequency plan table 314 that relates carrier frequency channels to the operation of the synthesizer 354, the first programmable frequency divider 708, and the second programmable frequency divider 710.

FIG. 7 shows a multiband embodiment of the frequency plan. First variable controlled oscillator 712 has a lower transmission bandwidth that may be the GSM transmit bandwidth. Second variable controlled oscillator 714 has higher transmission bandwidth that may be the DCS transmit bandwidth. In a multiband configuration, only one of the variable controlled oscillators is active at a time. First variable controlled oscillator 712, for GSM operation, has a frequency range, or bandwidth, corresponding to the extended GSM transmit band of 880–915 MHz. For DCS operation, second variable controlled oscillator 714 has a frequency range corresponding to the DCS transmit band of 1710–1785 MHz.

First variable controlled oscillator 712 or second variable controlled oscillator 714 outputs a modulated transmit signal at frequency $f_{TxHIGH}$ or frequency $f_{TxLOW}$, respectively, that is supplied to antenna 26 for wireless transmission to base transceiver station 32. The modulated transmit signal is typically passed through several stages of amplification, filtering and switching before it reaches antenna 26. The first variable controlled oscillator 712 or second variable controlled oscillator 714 output is also supplied to downconversion mixer 702. Downconversion mixer 702 produces a transmit-loop signal having an intermediate frequency $f_{IF}$ by mixing the modulated transmit signal from first variable controlled oscillator 712, or second variable controlled oscillator 714, with the reference signal having transmission local oscillation frequency $f_{TxLO}$ from switch 718 of the local oscillation chain 720.

The local oscillation chain 720 may also provide input signals for the receiver. In FIG. 7, the receiver includes downconverter 370. FIG. 7 shows the low local oscillation signal and the high local oscillation signal being supplied to the downconverter 370. Alternatively, the receiver switch 718 may provide the input signal for the receiver including the downconverter 370. The receiver may be a direct conversion receiver such as the direct conversion receiver described in U.S. patent application Ser. No. 09/260,919, entitled "Direct Conversion Receiver"; and U.S. patent application Ser. No. 09/386,865, entitled "Multi-Band Transceiver Utilizing Direct Conversion Receiver." U.S. patent application Ser. Nos. 09/260,919 and 09/386,865 are entirely incorporated herein by reference.

Figure 8:
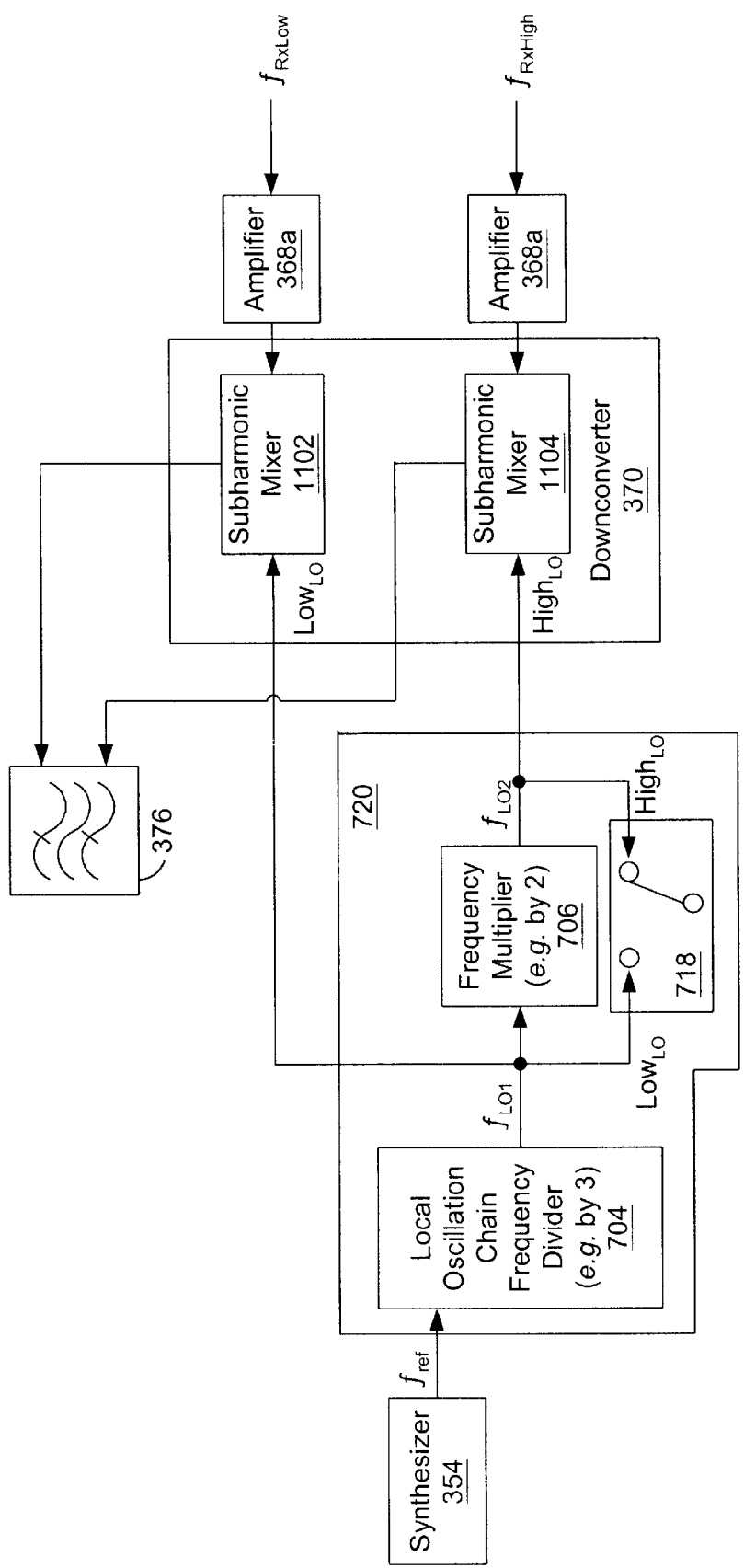
FIG. 8 is a block diagram of part of the radio frequency module of FIG. 3 including a synthesizer, and portions of the downconverter.

FIG. 8 is a block diagram of part of the radio frequency module of FIG. 3 including the synthesizer 354, the local oscillation chain 720, the downconverter 370, dual low noise amplifier 368 (shown as individual amplifiers 368a), and the channel filter 376. Downconverter 370 includes first subharmonic mixer 1102, and second subharmonic mixer 1104.

The receiver local oscillation plan generally depends upon the mixers. Preferably, the receiver local oscillation frequency should be different from the carrier waveform frequency. Even in a direct conversion receiver, where the synthesizer 354 signal reference frequency is designed to be the same as the carrier waveform frequency, the receiver local oscillation frequency should differ from the carrier waveform frequency. Some subharmonic mixers require a receiver local oscillation frequency that is approximately half of the carrier waveform frequency.

Amplifiers 368a receive carrier waveform signals from the antenna 26. Carrier waveform signal may be at frequency $f_{RxLow}$, for example in a GSM communication system. Alternatively, carrier waveform signal may be at frequency $f_{RxHigh}$ in a DCS communication system. Amplifiers 368a amplify the carrier waveform signals. First subharmonic mixers 1102 and second subharmonic mixer 1104 allow for the processing of received carrier waveforms with local oscillation frequencies that differ from the carrier waveform frequency. The subharmonic mixers receive the low oscillation signal and the high oscillation signal from local oscillation chain 720. Local oscillation chain 720 receives a synthesizer signal having a reference frequency from synthesizer 354. The output of subharmonic mixers 1102 and 1104 is sent to channel filter 376 and ultimately to be processed by the baseband module 202.

In FIG. 7, the transmit loop-signal from the downconversion mixer 702 is introduced to low pass filter 506. Low pass filter 506 limits the maximum frequency of the transmit-loop signal and attenuates any high frequency spurs or mixing products. The low pass filter 506 passes the transmit-loop signal to the quadrature mixer 716. Quadrature mixer 716 mixes the "I" and "Q" signals with a ninety-degree phase-displaced transmit-loop signal and sums the resulting signals to generate a modulated transmit-loop signal having intermediate frequency $f_{IF}$.

Figure 9:
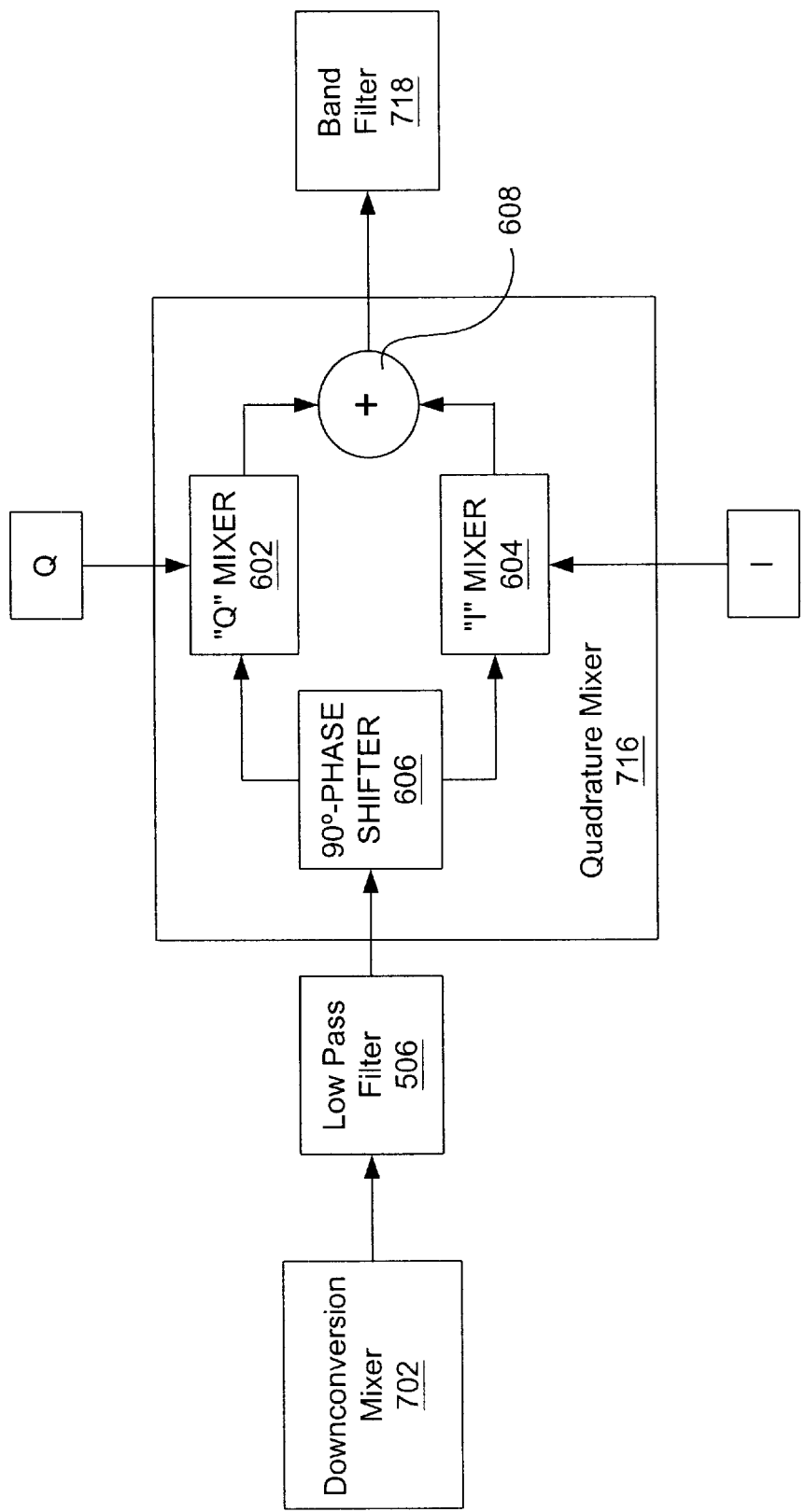
FIG. 9 is a block diagram of the quadrature mixer of FIG. 7.

Quadrature mixer 716 is illustrated in more detail in FIG. 9. Quadrature mixer 716 is one type of modulator that may be with the frequency plan. Those of ordinary skill in the art will recognize alternative modulators such as passive modulators. Quadrature mixer 716 includes a "Q" mixer 602, an "I" mixer 604, a 90°-phase shifter 606, and a summer 608. Phase shifter 606 splits the input signal, here the transmit-loop signal, from low pass filter 506 into two 90° phase-displaced signals. "I" Mixer 604 mixes the "I" modulating signal with a 0° reference signal, and "Q" mixer 602 mixes the "Q" modulating signal with a 90° reference signal. Summer 608 combines the output signals from "Q" mixer 602 and "I" mixer 604 to form the modulated transmit-loop signal having both "I" and "Q" components.

In FIG. 7, the modulated transmit-loop signal from the quadrature mixer 716 is then introduced to a band filter 718. The band filter 718 produces a filtered modulated transmit-loop signal.

The filtered modulated transmit-loop signal is then introduced to the second programmable frequency divider 710. Second programmable frequency divider 710 may divide by variable D2. Second programmable frequency divider 710 produces a frequency divided signal having a divided frequency $f_{DF}$, where frequency $f_{DF}$ is the same frequency as frequency $f_{comp}$. First programmable frequency divider 708 and second programmable frequency divider 710 are of a type known to those of ordinary skill in the art.

The frequency divided signal is introduced as a second input to phase detector 406. Based on a comparison of the phases of the signals from the first programmable frequency divider 708 and the second programmable frequency divider 710, phase detector 408 generates an appropriate output signal. If the phases of the two signals are aligned, the transmit-loop is "locked". If the transmit-loop is locked, no adjustment voltage is asserted and first variable control oscillator 712, or second variable controlled oscillator 714, continues to oscillate at the same frequency. If one signal leads or lags the other, phase detector 406 outputs a pulse proportional to the phase difference between the two signals. The output pulses are commonly referred to as "UP" or "DOWN" signals and typically have a width or duration proportional to the phase difference between the phase detector 406 input signals.

Charge pump 410, based on the signal received from phase detector 406, generates a current that adjusts the modulated transmit signal frequency of the first variable control oscillator 712, or the second variable controlled oscillator 714. The charge pump 410 current is increased or decreased as necessary to for correct phase leads or lags. If the transmit-loop is locked, the charge pump 304 current is neither increased nor decreased.

Loop filter 412 develops a control voltage from the charge pump 410 current and applies it to the first variable control oscillator 712, or second variable controlled oscillator 714. A common configuration for loop filter 412 is a simple single-pole, low-pass filter that can be realized with a single resistor and capacitor. Variable control oscillator 712, or second variable controlled oscillator 714, oscillates about a specific transmission frequency channel that is adjusted as necessary by the control voltage applied by loop filter 412. In GSM, the bandwidth of each transmit frequency channel is 200 kHz.

If the mobile communication device 22 is operating in low, or GSM mode, the output of switch 718, can be represented as:

$$f_{TxLO} = f_{LO1} = \frac{f_{ref}}{3}. \quad \text{(equation 3)}$$

And:

$$f_{COMP} = \left(\frac{f_{ref}}{3}\right)\left(\frac{1}{D_1}\right). \quad \text{(equation 4)}$$

When the transmit-loop is locked:

$$f_{COMP} = \frac{2f_{TxLO} - f_{TxLOW}}{D_2} = \frac{f_{IF}}{D_2} = \left(\frac{f_{ref}}{3}\right)\left(\frac{1}{D_1}\right). \quad \text{(equation 5)}$$

Multiplying both sides of equation 5 by "$D_2$" results in:

$$2f_{TxLO} - f_{TXLOW} = \left(\frac{D_2}{D_1}\right)\left(\frac{f_{ref}}{3}\right). \quad \text{(equation 6)}$$

Solving for $f_{TxLOW}$ and substituting from equation 3 results in:

$$f_{TxLOW} = \frac{2f_{ref}}{3} - \left(\frac{D_2}{D_1}\right)\left(\frac{f_{ref}}{3}\right). \quad \text{(equation 7)}$$

If transmitter 700 is operating in DCS mode, the output of switch 718, can be represented as:

$$f_{TxLO} = f_{LO2} = \frac{2f_{ref}}{3}. \quad \text{(equation 8)}$$

And:

$$f_{COMP} = \left(\frac{2f_{ref}}{3}\right)\left(\frac{1}{D_1}\right). \quad \text{(equation 9)}$$

When the transmitter 700 transmit-loop is locked:

$$f_{COMP} = \frac{f_{TxLO} - f_{TxHIGH}}{D_2} = \frac{f_{IF}}{D_2} = \left(\frac{2f_{ref}}{3}\right)\left(\frac{1}{D_1}\right). \quad \text{(equation 10)}$$

Multiplying both sides of equation 10 by "$D_2$" results in:

$$f_{TxLO} - f_{TxHIGH} = \left(\frac{D_2}{D_1}\right)\left(\frac{2f_{ref}}{3}\right). \quad \text{(equation 11)}$$

Solving for $f_{TxHIGH}$ and substituting from equation 8 results in:

$$f_{TxHIGH} = \frac{4f_{ref}}{3} - \left(\frac{D_2}{D_1}\right)\left(\frac{2f_{ref}}{3}\right). \quad \text{(equation 12)}$$

Equations 7 and 12 demonstrate that the transmission channel can be programmed by changing the synthesizer 354 signal frequency $f_{ref}$ and by changing the divide ratios $D_2$ and $D_1$. In one embodiment, the transmission channel is adjusted according to the frequency plan table 314.

Ideally, a system for selecting transmission channels to reduce undesirable frequency interactions: (1) will vary the transmit-loop signal frequency $f_{IF}$ with each transmission channel; (2) will not vary the synthesizer 354 signal reference frequency $f_{ref}$ too far from the receiver carrier waveform frequency; (3) will not require a synthesizer 354 tuning range that is too broad; and (4) even though the system will vary the transmit-loop signal frequency $f_{IF}$, the plan will not vary the transmit-loop signal frequency $f_{IF}$ too much at the in-loop modulator.

The frequency plan allows the transmit-loop signal frequency $f_{IF}$ to remain a subharmonic of the synthesizer 354 signal reference frequency $f_{ref}$ by varying the transmit-loop signal frequency $f_{IF}$ with each transmission channel. Maintaining the transmit-loop signal frequency $f_{IF}$ as a subharmonic of the synthesizer 354 signal reference frequency $f_{ref}$ eliminates zero-crossing spurs in the transmit-loop.

Limiting the variance between the synthesizer 354 signal reference frequency $f_{ref}$ and the receiver carrier waveform frequency, results in a minimization of intra-frame frequency jumps. Minimizing intra-frame frequency jumps increases the switching speed for multi-slot operations such as those used in time division multiple accessing. Limiting the synthesizer 354 tuning range, reduces the cost to manufacture the synthesizer 354. By limiting the variance of the transmit signal frequency $f_{IF}$ at the in-loop modulator, the third and fourth harmonics may be suppressed by a single filter, such as band filter 718. Reducing third and fourth harmonics reduces 4-x-modulation spurs in the transmit-loop.

The frequency plan associates each transmit channel frequency with the plurality of combinations of divide ratios D1 and D2 as well as the frequency $f_{ref}$ that can be used to obtain the transmit channel frequency. Based on the constraints chosen by the designer based on the economies of the particular architecture, the divider ratio and frequency $f_{ref}$ combinations that fail the constraints are eliminated and a frequency plan table is formed that relates each required transmit channel to the optimal variable combination that can be used to produce the transmit channel. The possible constraints include but are not limited to maintaining a sufficient frequency offset between frequency $f_{ref}$ and frequency $f_{ref}$ associated spurious tones, minimization of the tuning range required to of the synthesizer 354, or other device, that produces $f_{ref}$, and minimization of the range that $f_{IF}$ must cover in the transmit-loop for each transmit channel frequency. The divide ratios determine the programming for first programmable frequency divider 708 and second programmable frequency divider 710.

Figure 10:
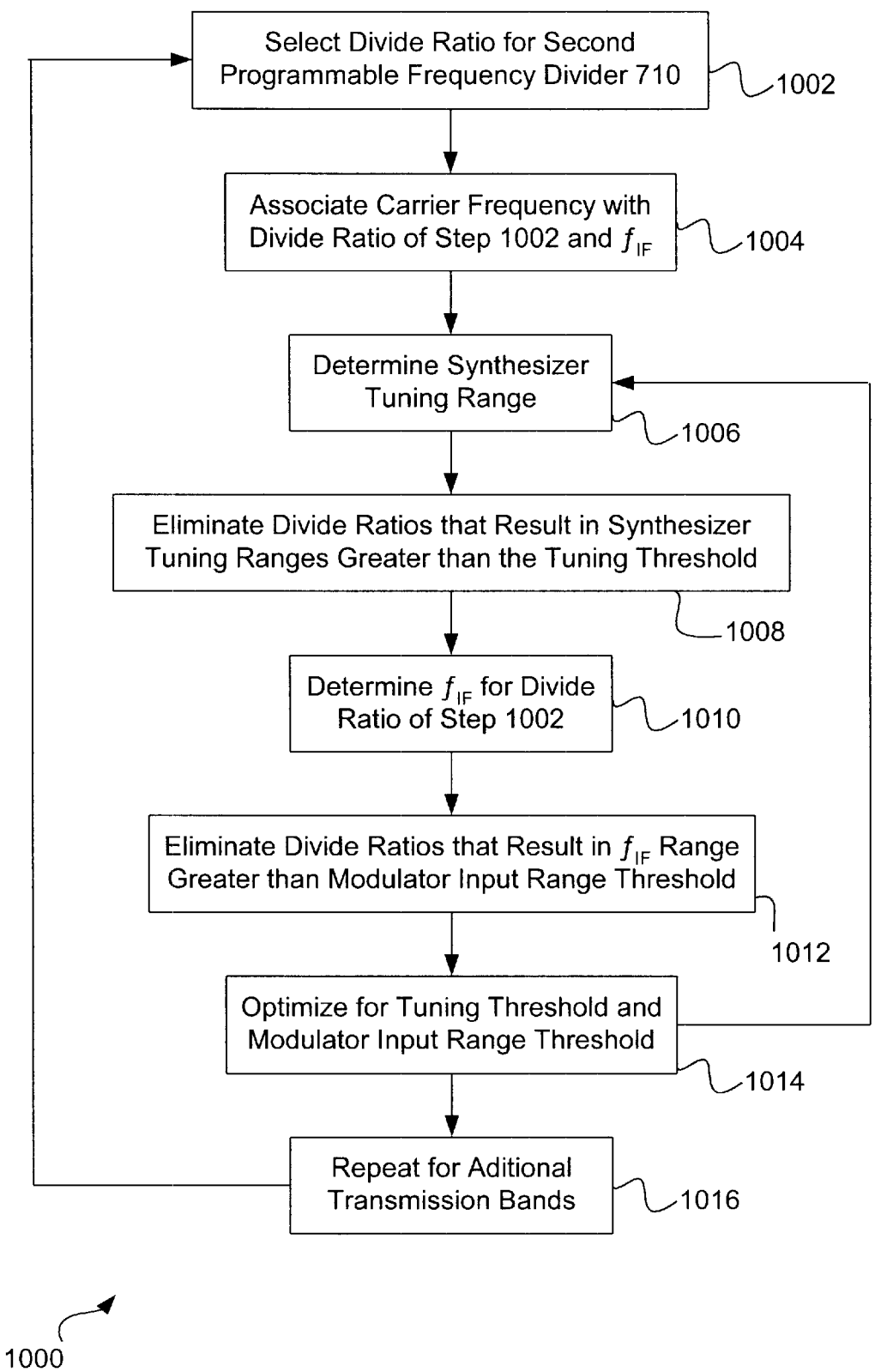
FIG. 10 is a flowchart illustrating a system for creating the frequency plan table.

FIG. 10 is a flowchart 1000 illustrating a system for creating the frequency plan table 314. The frequency plan table 314 may be determined by: (1) selecting a divide ratio for divider 710 (step 1002); (2) associating each transmission carrier signal frequency with the divide ratio of step 1002 and tabulating the combinations of divide ratios of divider 708 and $f_{ref}$ required (step 1004); (3) determining the minimum synthesizer 354 tuning range based on acceptable spurious offsets from the $f_{ref}$ required to cover the transmit channels with the various selections of the variables involved (divider 708 ratios and $f_{ref}$) step 1004 (step 1006); (4) eliminating the divide ratio and $f_{ref}$ combinations that require a tuning range greater than a synthesizer 354 tuning range threshold (step 1008); (5) determine the transmit-loop signal frequency $f_{IF}$ range for the divide ratios of step 1002 (step 1010); (6) eliminate divide ratio and $f_{ref}$ combinations requiring a frequency $f_{IF}$ range for the modulator input greater than a modulator input frequency range threshold (step 1012); (7) repeating steps 1006 to 1010 to optimize for the synthesizer 354 tuning range threshold and the modulator input frequency range threshold (step 1014); (8) if the mobile communication device 22 supports multiple transmission frequency bands, repeat steps 1–7 for each transmission frequency band (step 1016).

Step 1002 may be accomplished by setting divide ratio D2 equal to 1 and 2. Step 1004 may be accomplished using equation 1 (with $f_{ref}=f_{out}$) and using D1 equal to 9, 10, 11 and 12. The synthesizer 354 tuning range threshold and the modulator input frequency range threshold are determined by the mobile communication device 22 designer based on the particular transmitter architecture chosen by the designer and the operating characteristics of the synthesizer 354 and modulator selected by the designer. Those of ordinary skill in the art are familiar with selecting such thresholds for optimization designing.

The result of steps 1002 to 1016 is a frequency plan table 314 that relates transmission frequency channels to the operation of the synthesizer 354, the first programmable frequency divider 708, and the second programmable frequency divider 710. The frequency plan table 314 may be stored in a memory element in the mobile communication device 22 and accessed whenever the mobile communication device 22 accesses a transmit frequency channel. The frequency plan table 314 may be stored in the baseband memory 304. When the transmit-loop is programmed: desired reference frequency $f_{ref}$ may be sent to the synthesizer via line 722; divide ratio D1 may be sent to the first programmable frequency divider 708 via line 724, and divide ratio D2 may be sent to the second programmable frequency divider 708 via line 726.

In another embodiment, the frequency plan table 314 may be stored in the radio frequency module 208. In this embodiment, the setting of the divide ratios and desired reference frequency $f_{ref}$ may be automatic.

In another embodiment, additional restraints, other than the tuning threshold and $f_{if}$ threshold, may be placed upon the divide ratios for requirements such as a minimum transmit frequency range and/or a minimum variable controlled oscillator tuning ranges.

The frequency plan table 314 and the circuit shown in FIG. 7, allow the mobile communication device 22 to use a single synthesizer 354 and a transmit-loop to implement a multiband transmitter. The mobile communication device 22 may be used as a GSM transmitter with multi-slot capabilities. Problems associated with fractional-N spurs are minimized in the mobile communication device 22 incorporating the frequency plan.

It should be emphasized that the above-described embodiments of the frequency plan, particularly, any "preferred" embodiments, are merely possible examples of implementations, merely set forth for a clear understanding of the principles of the frequency plan. Many variations and modifications may be made to the above-described embodiment(s) of the frequency plan without departing substantially from the spirit and principles of the frequency plan. All such modifications and variations are intended to be included here within the scope of this disclosure and the frequency plan and protected by the following claims.

What is claimed is:

1. A wireless communication device, comprising:

(a) a first frequency divider,
  the first frequency divider being configured to accept a reference signals, having a local oscillation frequency, and
  the first frequency divider being configured to output a comparison signal, the comparison signal having a comparison frequency;

(b) a mixer,
  the mixer being configured to accept the reference signal having the local oscillation frequency,
  the mixer being configured to output a transmit-loop signal, and the transmit-loop signal having an intermediate frequency at the output of the mixer;
(c) a second frequency divider,
the second frequency divider being configured to accept the transmit-loop signal having an intermediate frequency,
the second frequency divider being configured to output a divided frequency signal having a divided frequency; and
(d) a variable controlled oscillator, where the variable controlled oscillator outputs a transmission signal, the transmission signal being based in part on a comparison between the comparison signal and the frequency divided signal having a divided frequency.

2. The wireless communication device of claim 1, where the reference signal is generated by a synthesizer.

3. The wireless communication device of claim 1, where the reference signal is processed by a third frequency divider prior to acceptance by the first frequency divider.

4. The wireless communication device of claim 1, further including:
(e) a downconverter, the downconverter configured to accept the reference signal, where the downconverter processes a received carrier waveform using the reference signal.

5. The wireless communication device of claim 1, where the output of the mixer is processed by a modulator prior to acceptance by the second frequency divider.

6. The wireless communication device of claim 1, where the variable controlled oscillator is a voltage controlled oscillator.

7. The wireless communication device of claim 1, where the first frequency divider and the second frequency divider are programmable frequency dividers.

8. The wireless communication device of claim 7, further including:
(e) a frequency plan table, where the frequency plan table includes divide ratios for programming the first frequency divider and the second frequency dividers.

9. A system for transmitting information, the system comprising:
(a) first means for frequency dividing, the first means for frequency dividing being configured to accept a reference signal, having a local oscillation frequency, the first means for frequency dividing configured to output a comparison signal, the comparison signal having a comparison frequency;
(b) mixing means for producing a transmit-loop signal the mixing means configured to accept the reference signal having the local oscillation frequency, the transmit-loop signal having an intermediate frequency at the output of the mixing means;
(c) a second means for frequency dividing, the second means for frequency dividing configured to accept the transmit-loop signal having an intermediate frequency, the second means for frequency dividing being configured to output a divided frequency signal having a divided frequency; and
(d) oscillation means, where the oscillation means outputs a transmission signal, the transmission signal being based in part on a comparison between the comparison signal and the frequency divided signal.

10. The system of claim 9, where the reference signal is generated by a synthesizer.

11. The system of claim 9, where the reference signal is processed by a frequency divider prior to acceptance by the first frequency divider.

12. The system of claim 9, further including:
(e) means for downconverting a received carrier waveform, the means for downconverting configured to accept the reference signal, where the means for downconverting processes a received carrier waveform using the reference signal.

13. The system of claim 9, where the output of the means for mixing is processed by a modulator prior to acceptance by the second means for frequency dividing.

14. The system of claim 9, where the oscillation means is a voltage controlled oscillation means.

15. The system of claim 9, where the first means for frequency dividing and the second means for frequency dividing are programmable means for frequency dividing.

16. The system of claim 15, further including:
(e) means for frequency planning, where the means for frequency planning controls the operation of the first means for frequency dividing.

17. A computer readable medium for transmitting information, the system comprising:
(a) first logic for frequency dividing, the first logic for frequency dividing configured to accept a reference signal, having a local oscillation frequency, the first logic for frequency dividing configured to output a comparison signal, the comparison signal having a comparison frequency;
(b) logic for producing a transmit-loop signal, the logic for producing a transmit-loop signal configured to accept the reference signal having the local oscillation frequency, the transmit-loop signal having an intermediate frequency at the output of the logic for producing a transmit-loop signal;
(c) second logic for frequency dividing, the second logic for frequency dividing configured to accept the transmit-loop signal having an intermediate frequency, the second logic for frequency dividing being configured to output a divided frequency signal having a divided frequency; and
(d) logic for oscillating, where the logic for oscillating outputs a transmission signal, the transmission signal being based in part on a comparison between the comparison signal and the frequency divided signal.

18. The system of claim 17, where the reference signal is generated by a synthesizer.

19. The system of claim 17, where the reference signal is processed by a frequency divider prior to acceptance by the first logic for frequency dividing.

20. The system of claim 17, further including:
(e) logic for downconverting a received carrier waveform, the logic for downconverting configured to accept the reference signal, where the logic for downconverting processes a received carrier waveform using the reference signal.

21. The system of claim 17, where the output of the logic for producing a transmit-loop signal is processed by a modulator prior to acceptance by the second logic for frequency dividing.

22. The system of claim 17, where the first logic for frequency dividing and the second logic for frequency dividing are programmable logic for frequency dividing.

23. The system of claim 22, further including:
(e) logic for a frequency plan table, where the logic for a frequency plan table includes divide ratios for programming the logic for first frequency divider and the logic for second frequency dividers.

* * * * *

UNITED STATES PATENT AND TRADEMARK OFFICE
CERTIFICATE OF CORRECTION

PATENT NO. : 6,671,500 B1
DATED : December 30, 2003
INVENTOR(S) : Damgaard et al.

It is certified that error appears in the above-identified patent and that said Letters Patent is hereby corrected as shown below:

Column 22,
Line 58, delete "signals," and replace with -- signal --.

Column 23,
Line 44, delete "signal," and replace with -- signal --.

Column 24,
Line 23, delete "signal," and replace with -- signal --.

Signed and Sealed this

Second Day of March, 2004

JON W. DUDAS
*Acting Director of the United States Patent and Trademark Office*